(12) United States Patent
Yamazaki et al.

(10) Patent No.: US 6,271,818 B1
(45) Date of Patent: Aug. 7, 2001

(54) SEMICONDUCTOR DEVICE

(75) Inventors: Shunpei Yamazaki, Tokyo; Jun Koyama; Hisashi Ohtani, both of Kanagawa, all of (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 0 days.

(21) Appl. No.: 09/696,479

(22) Filed: Oct. 24, 2000

Related U.S. Application Data

(63) Continuation of application No. 08/997,919, filed on Dec. 24, 1997, now Pat. No. 6,147,667.

(30) Foreign Application Priority Data

Dec. 27, 1996 (JP) .................................................. 8-358974

(51) Int. Cl.[7] .................................................. G09G 3/36
(52) U.S. Cl. .................. 345/92; 345/98; 257/59
(58) Field of Search ................. 345/92, 98, 206, 345/57, 59, 66, 62, 69

(56) References Cited

U.S. PATENT DOCUMENTS

| 5,250,931 | * | 10/1993 | Misawa et al. | 345/206 |
| 5,550,070 | * | 8/1996 | Funai et al. | 438/486 |
| 5,818,068 | * | 10/1998 | Sasaki et al. | 257/59 |
| 5,888,857 | * | 3/1999 | Zhang et al. | 438/486 |
| 5,959,599 | * | 9/1999 | Hirakata | 345/92 |

* cited by examiner

Primary Examiner—Steven Saras
Assistant Examiner—Alecia D. Nelson
(74) Attorney, Agent, or Firm—Fish & Richardson P.C.

(57) ABSTRACT

A systemized active matrix display in which a pixel matrix circuit, a driver circuit and a logic circuit are mounted on the same substrate, is formed. A TFT of the present invention has such characteristics as to be able to operate in a wide driving frequency range of 0.05 to 2 GHz, and by designing a channel length and a film thickness of a gate insulating film of the TFT according to characteristics required by circuits, it is possible to form a high frequency driving circuit and a low frequency driving circuit on the same substrate.

32 Claims, 19 Drawing Sheets

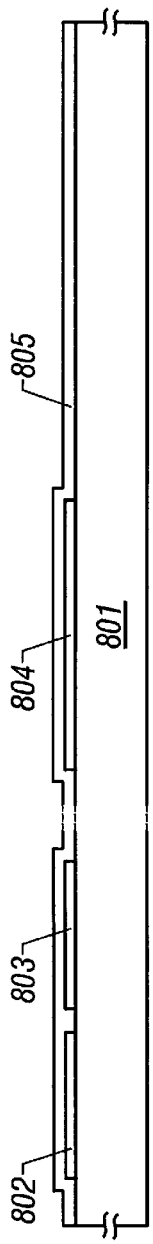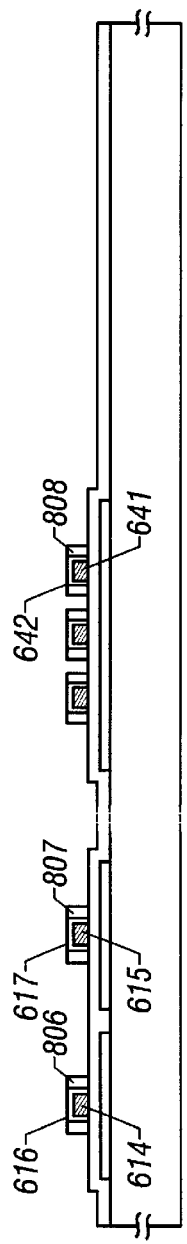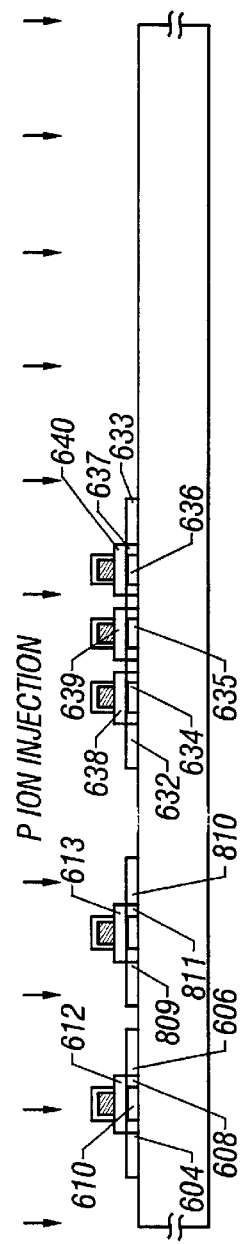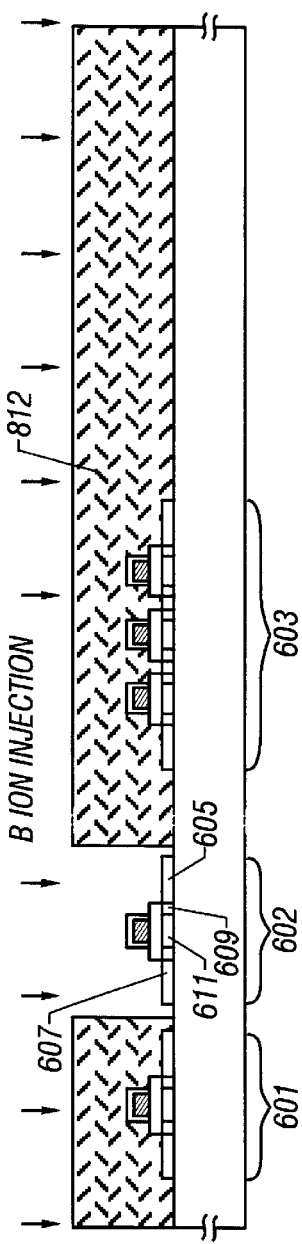

SEMICONDUCTOR DEVICE

This is a continuation of U.S. application Ser. No. 08/997,919, filed Dec. 24, 1997 now U.S. Pat. No. 6,147, 667.

BACKGROUND OF THE INVENTION

1. Field of the Invention

The present invention relates to a structure of an active matrix display (including an active matrix type liquid crystal display device, an EL display device, and an EC display device) which is constituted by thin film transistors (TFTs) formed by using a crystalline thin film semiconductor. Also, the present invention relates to an electrooptical device using such an active matrix display as a display device.

2. Description of the Related Art

In recent years, there has been rapidly developed a technique in which a pixel matrix circuit and a driving circuit are integrally formed on the same substrate by using TFTs. The reason is that the demand for an active matrix display (also called an active matrix panel) has been increased in everyday life.

In the active matrix display, a TFT is disposed for each of a plurality of pixels arranged in matrix, and an electric charge going in and out of each of pixel electrodes (driving electrodes) is controlled by a switching function of the TFT.

As such an active matrix display, there is known one disclosed in U.S. Pat. No. 5,250,931 (Misawa et al.). The U.S. patent discloses an active matrix panel in which a pixel matrix and driver circuits (source line driver circuit and gate line driver circuit) are formed on the same substrate, and also discloses applied products thereof. The U.S. patent discloses that the driver circuit is constituted by a shift register, a sample-and-hold circuit, a buffer and the like.

As disclosed in the above patent, the conventional active matrix display is only constituted by the pixel matrix and the driver circuit on the same substrate. However, in the present everyday life, the active matrix display is used for various applied products (electrooptical devices and the like), and there are increasing requests for miniaturization, improvement of performance, and decrease of consumption of electric power.

In such circumstances, an SOP (System On Panel) plan has been recently proposed as means for miniaturizing the active matrix display and improving the performance thereof. The SOP plan is a plan to mount a logic circuit (signal processing circuit such as a display control circuit and an arithmetic circuit), which is conventionally externally equipped to the active matrix display, on the same substrate by using TFTs.

However, a technique for forming TFTs capable of realizing the plan has not been established. The reason is that it is difficult to constitute an electric circuit requiring high frequency driving, such as a logic circuit, by TFTs using presently employed silicon thin films.

For example, in the current circumstances, there are well known a TFT using a silicon thin film (so-called high temperature polysilicon) formed through a heat treatment at about 900° C. and a TFT using a silicon thin film (so-called low temperature polysilicon) formed at a relatively low temperature of 600° C. or less. However, it is difficult to realize a TFT having such high speed performance that the TFT can constitute a logic circuit, by these silicon thin films.

Although the operating speed of a TFT can be tentatively improved by decreasing the size of the TFT, the reduction of a channel length (or gate length) causes a short channel effect, so that a trouble such as lowering of a drain withstand voltage occurs. Thus, in the case of a TFT using a conventional silicon thin film, the improvement of an operating speed by a scaling law reaches the limit, and it is difficult to further raise the operating speed in view of reliability. Also, there is a problem that crystal grains and crystal grain boundaries (grain boundaries) irregularly exist in the silicon thin film and the grain boundaries greatly affect the TFT characteristics to cause unevenness.

As described above, in the conventional TFT manufacturing technique, although the active matrix display as disclosed in the above U.S. patent can be constituted, it is difficult to integrate a logic circuit requiring higher speed operation.

In the case of a conventionally used IGFET (insulated Gate Field Effect Transistor) formed on single crystal silicon, it is possible to form the IGFET which can operate at both low frequency driving and high frequency driving by using the extremely superior crystallinity or the single crystal. However, in the IGFET formed on a single crystal silicon wafer, there is a problem that if a channel length is shortened to raise an operating speed, a short channel effect immediately becomes tangible.

Accordingly, since the IGFET for high frequency driving requires a specific treatment such as channel doping, it is common to separate an IC chip for high frequency driving from an IC chip for low frequency driving (for high withstand voltage driving) in order to avoid complication of manufacturing steps.

Thus, in the conventional technique, it is difficult to mount both a logic circuit for high frequency driving and a logic circuit for low frequency driving on the same substrate or the same chip, which causes a serious difficulty in realizing the SOP plan.

SUMMARY OF THE INVENTION

The present invention has been made to overcome the above problems, and an object of the invention is to provide a technique to realize an active matrix display having low consumption of electric power and multi-function in which both a circuit capable of operating at high frequency driving and a circuit capable of operating at low frequency driving (or high withstand voltage driving) are mounted on the same substrate. Another object of the invention is to provide a technique to realize a small-sized and inexpensive electrooptical device using such an active matrix display.

The term "active matrix display" in the present specification includes an active matrix type display device and a constituent substrate having the main function thereof. That is, for example, in an active matrix type liquid crystal display device, the term of the active matrix display includes not only the active matrix type liquid crystal display device but also an active matrix substrate (substrate on which TFTs are formed).

The present invention relates to an active matrix display comprising a pixel matrix circuit including at least a plurality of source lines, a plurality of gate lines, and a plurality of TFTs, a driver circuit including at least a source line driver circuit for driving the source lines and a gate line driver circuit for driving the gate lines; and a logic circuit for processing a signal required for driving the driver circuit and a signal including image information transmitted to the pixel matrix circuit, the pixel matrix circuit, the driver circuit, and the logic circuit being disposed on the same substrate, or the present invention relates to an active matrix display comprising an active matrix substrate in which the pixel matrix circuit, the driver circuit, and the logic circuit are disposed on the same substrate, an opposite substrate disposed opposite the active matrix substrate; and a liquid crystal layer held between the active matrix substrate and the opposite substrate.

According to an aspect of the present invention, the above active matrix display is characterized in that the pixel matrix circuit, the driver circuit, and the logic circuit are constituted by a plurality of TFTs each made of a crystalline silicon thin film, and the silicon thin film has a crystal structure made of a croup of a plurality of rod-shaped or flattened rod-shaped crystals crown substantially in parallel to each other and with directionality.

According to another aspect of the present invention, the above active matrix display is characterized in that the pixel matrix circuit, the driver circuit, and the logic circuit are constituted by a plurality of TFTs each made of a crystalline silicon thin film, and crystal lattices are continuously connected to each other in the inside of rod-shaped or flattened rod-shaped crystals constituting the silicon thin film so that the inside can be regarded as a single crystal for carriers.

According to a still another aspect of the present invention, the above active matrix display is characterized in that the pixel matrix circuit, the driver circuit, and the logic circuit are constituted by a plurality of TFTs each made of a crystalline silicon thin film, and subthreshold coefficients of the plurality of TFTs are within a range of 60 to 100 mV/decade for both an N-channel type TFT and a P-channel type TFT.

According to a still another aspect of the present invention, the above active matrix display is characterized in that the pixel matrix circuit, the driver circuit, and the logic circuit are constituted by a plurality of TFTs each made of a crystalline silicon thin film, and dimensions of the plurality of TFTs are different according to electrical characteristics required by the circuits constituted by the plurality of TFTs.

According to a still another aspect of the present invention, the above active matrix display is characterized in that the pixel matrix circuit, the driver circuit, and the logic circuit are constituted by a plurality of TFTs each made of a crystalline silicon thin film, and channel lengths (L) of the plurality of TFTs and/or film thicknesses (T) of gate insulating films of the TFTs are different according to electrical characteristics required by the circuits constituted by the plurality of TFTs.

According to a still another aspect of the present invention, the above active matrix display is characterized in that the pixel matrix circuit, the driver circuit, and the logic circuit are constituted by a plurality of TFTs each made of a crystalline silicon thin film, and among the plurality of TFTs, a film thickness of a gate insulating film of a TFT constituting a circuit requiring a driving frequency of 0.1 GHz or more is not larger than 500 Å, and a film thickness of a gate insulating film of a TFT constituting a circuit requiring a driving voltage exceeding 10 V is not less than 1000 Å.

According to a still another aspect of the present invention, the above active matrix display is characterized in that the pixel matrix circuit, the driver circuit, and the logic circuit are constituted by a plurality of TFTs each made of a crystalline silicon thin film, and the plurality of TFTs include both a high frequency driving TFT and a high withstand voltage driving TFT.

According to a still another aspect of the present invention, the above active matrix display is characterized in that the pixel matrix circuit, the driver circuit, and the logic circuit are constituted by a plurality of TFTs each made of a crystalline silicon thin film, and a plurality of circuits constituting the pixel matrix circuit, the driver circuit and the lotic circuit include at least two kinds of circuits which are different from each other in a driving frequency and/or an operating voltage.

BRIEF DESCRIPTION OF THE DRAWINGS

FIGS. 8A to 8D are views showing manufacturing steps of a CMOS structure and a pixel region.

DETAILED DESCRIPTION OF THE INVENTION

Preferred embodiments of the present invention will now be described in detail with reference to the drawings.

[Embodiment 1]

Figure 1:
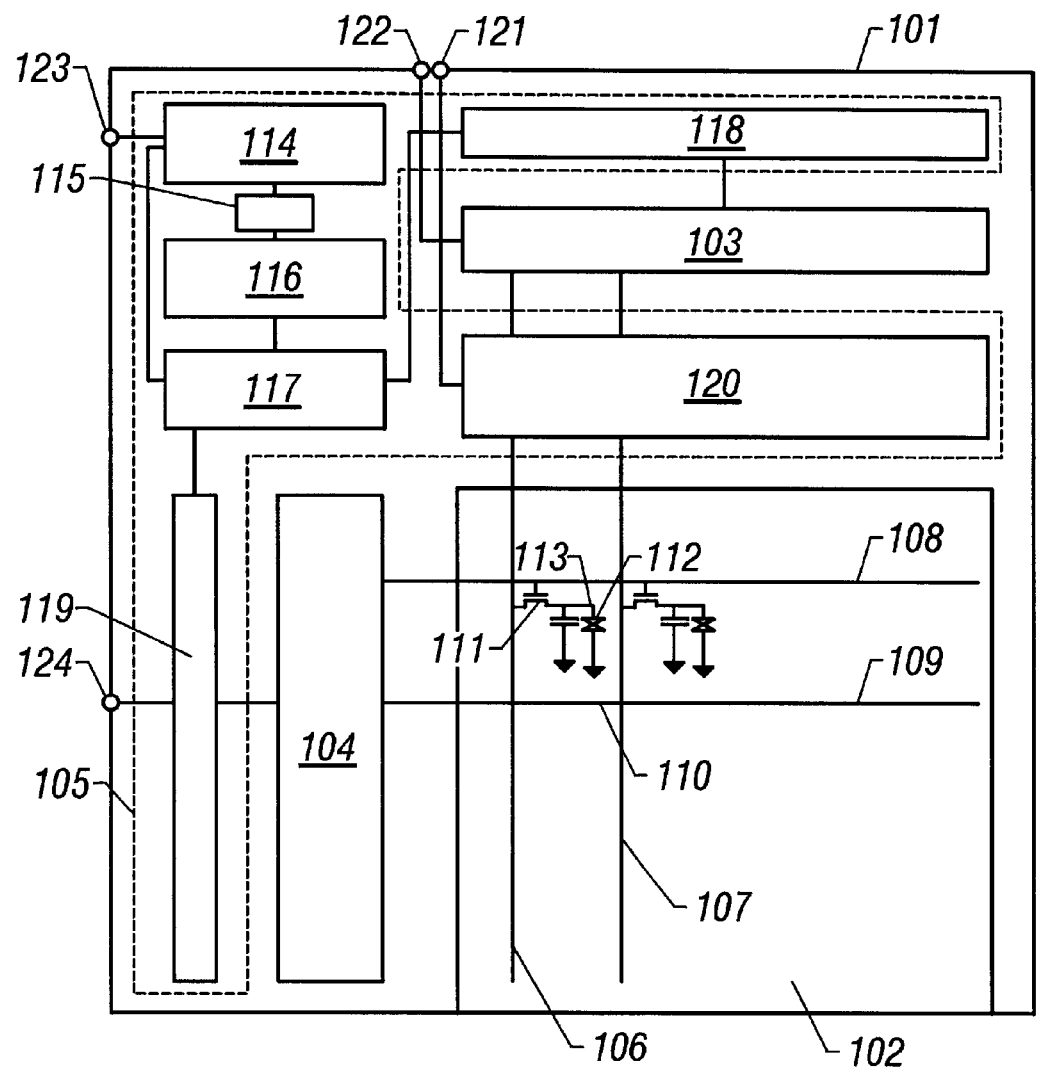
FIG. 1 is a block diagram of an active matrix display.

FIG. 1 is a block diagram of an active matrix display according to the present invention. The active matrix display of the present invention is constituted such that a pixel matrix circuit 102, a source line driver circuit 103, a gate line driver circuit 104, and a logic circuit 105 are integrally formed on a substrate 101.

Incidentally, the circuit structure shown in this embodiment is merely one example, and the circuit structure or the present invention is not limited thereto. The list of the present invention is that the logic circuit 105 is mounted on the same substrate, and the structure ot various circuits including the pixel matrix circuit 102, the source line driver circuit 103, the date line driver circuit 104, and the logic circuit 105 may be determined according to the necessity of circuit design.

In FIG. 1, the source line driver circuit 103 is mainly constituted by a shift register, a level shifter, a buffer, a latch circuit and the like. The gate line driver circuit 104 is mainly constituted by a shift register, a multiplexer, a level shifter, a buffer, and the like. Of course. the shift register may be substituted by a circuit having the same function, such as a counter and a decoder. Although FIG. 1 shows a circuit structure for a digital operation, if the active matrix display is designed for an analog operation, the source line driver circuit 103 includes a sample-and-hold circuit and the like.

Various circuits included in the source line driver circuit 103 and the gate line driver circuit 104 are constituted by, as a basic unit, an inverter circuit of CMOS structure in which an N-channel TFT and a P-channel TFT are complementarily combined with each other. Of course, although a single pole circuit may be used, a static type or dynamic type circuit of a CMOS structure is suitable in view of low consumption of electric power.

The pixel matrix circuit 102 is constituted by a plurality of pixel regions 110 arranged in matrix, which are surrounded by a plurality of source lines 106 and 107 connected to the source line driver circuit 103 and a plurality of gate lines 108 and 109 connected to the gate line driver circuit 104. Each of the plurality of pixel regions 110 include a pixel TFT 111, a liquid cell 112, and an auxiliary capacitance 113. Although not shown, the liquid crystal cell 112 is constituted by a pixel electrode, an opposite electrode, and a liquid crystal held therebetween.

The logic circuit 105 indicates all circuits required for processing signals necessary for carrying out image display, such as processing of a start pulse, a clock signal and the like for driving the source line driver circuit 103 and the gate line driver circuit 104, and processing of a video signal for making the pixel matrix circuit 102 carry out the image display.

In the embodiment shown in FIG. 1, the logic circuit 105 includes a phase comparator 114, a LPF (Low Pass Filter) 115, a VCO (Voltage Controlled Oscillator) 116, a frequency divider 117, an oscillator 118 for source line driver (for horizontal scanning), an oscillator 119 for gate line driver (for vertical scanning), and a D/A converter (digital-to-analog converter) 120.

The present inventors consider that it is possible to realize a system display having a function of CPU (Central Processing Unit) by monolithically mounting other not-shown logic circuits, for example, an I/O port for inputting and outputting signals transmitted from an image sensor or CCD, amplifying circuits (differential amplifier, operational amplifier, comparator, etc.), an A/D converter, a memory (RAM, ROM, etc.) for storing data, and ultimately an arithmetic circuit.

Reference numeral 121 denotes an input terminal for a digital tone signal, 122 denotes an input terminal of a bit signal for selecting the digital tone signal, 123 denotes an input terminal of a horizontal scanning synchronous signal, and 124 denotes an input terminal of a vertical scanning synchronous signal. Of course, if an oscillator circuit for generating the analog signal, bit signal, and synchronous signal is integrated on the substrate, the input terminals are not necessary.

(Silicon Thin Film Required in the Present Invention)

The most important factor for realizing the active matrix display as shown in FIG. 1 will now be described. As described in the prior art, it is difficult to mount both a high frequency driving circuit and a low frequency driving (high withstand voltage driving) circuit on the same substrate by a conventional silicon thin film. Thus, in order to constitute the active matrix display as shown in FIG. 1, it is necessary to form such a silicon thin film as realizes a TFT capable of operating at a wide frequency range.

The present invention enables realization of the active matrix display with the structure as shown in FIG. 1 by a TFT having an active layer of a quite novel silicon thin film described below. This quite novel silicon thin film is a material invented by the present inventors, and the TFT using this material has unique features in the method of forming an active layer and a gate insulating film, and in the structure of the silicon thin film constituting the active layer. Here, steps up to the formation of the gate insulating film will first be described with reference to FIGS. 2A to 2E.

First, a substrate 201 having an insulating surface is provided. In this embodiment, although a quartz substrate is used, a substrate with a silicon oxide film or the like thereon as an under layer may be used. However, since a heat treatment at a temperature of 700 to 1100° C. is necessary to form the silicon thin film used in the present invention, the substrate 201 must have such heat resistance as is able to withstand the heat in the temperature range.

Next, a noncrystalline silicon film (amorphous silicon film) 202 with a thickness of 100 to 750 Å (preferably 150 to 450 Å) is grown by a plasma CVD method, a sputtering method, or a low pressure thermal CVD method. The film thickness is made thicker than a finally required thickness by an amount decreased in a subsequent thermal oxidation step. The low pressure thermal CVD method using a silane-based gas ($SiH_4$, $Si_2H_6$, $Si_3H_8$, etc.) as a film forming gas is preferable since damage due to generation rate of natural nuclei in a later crystallizing step is low.

After the amorphous silicon film 202 is grown, the amorphous silicon film 202 is crystallized to form a crystalline silicon film (polysilicon film). As a means for crystallization, a technique disclosed in Japanese Patent Unexamined Publication No. Hei. 7-130652 is used. The technique disclosed in the publication is such that a catalytic element (typically Ni) is added into an amorphous silicon film to facilitate crystallization.

The publication discloses a means for adding the catalytic element into the entire surface of the amorphous silicon film, and a method of selectively adding the element. Although both methods can be used basically, the latter method is preferable since it is superior in the control of direction of crystal growth. Thus, in this embodiment, the case of using the latter method w ill be described.

After the amorphous silicon film 202 is grown, a mask 203 made of a silicon oxide film for selectively adding Ni (nickel) is formed. The mask of the silicon oxide film is provided with an openings 204 by patterning. It is preferable that a side of the opening 204 has a width of at least 10 $\mu$m. If the width is less than this value, in a later step of coating a solution containing the catalytic element, there occurs a fear that the solution does not reach the inside of the opening by surface tension. In this embodiment, in FIG. 2A, the width of the opening is made 10 to 20 $\mu$m, and the length thereof is made tens to hundreds $\mu$m in the direction perpendicular to this paper.

Next, in an oxygen atmosphere, irradiation of UV light is carried out so that an extremely thin oxide film (not shown) is formed on the exposed surface of the amorphous silicon film 202. This oxide film is formed to improve the wettability of a solution in a solution coating step which is later carried out to introduce nickel for promoting crystallization. As the catalytic element for promoting crystallization, an element such as Fe, Co, Sn, Pd, Pb, Pt, Cu or Au may be used other than Ni.

Figure 2A:
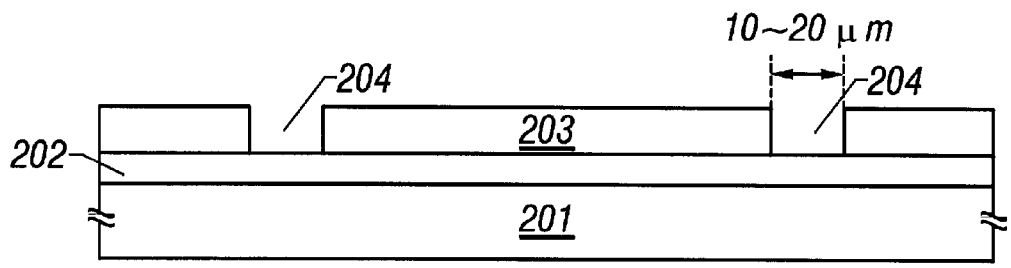
FIGS. 2A to 2E are views showing steps of forming a silicon thin film.
Figure 2B:
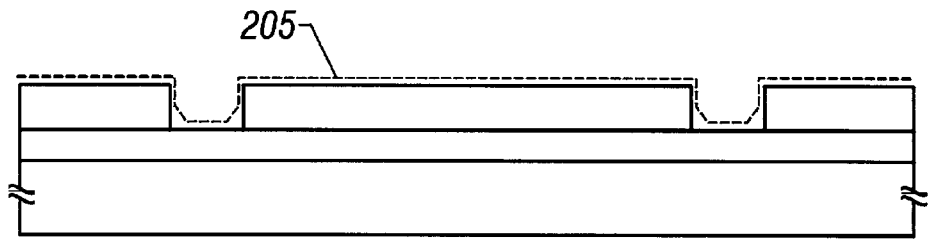

Next, a solution of nickel nitrate (or nickel acetate) containing a predetermined concentration (100 ppm in weight in this embodiment) of nickel is dropped, and a thin aqueous film 205 containing nickel is formed by a spin coating method. The concentration of nickel added in the amorphous silicon film 202 can be easily controlled by adjusting the concentration of nickel salt solution in the solution coating step (FIG. 2B).

Figure 2C:
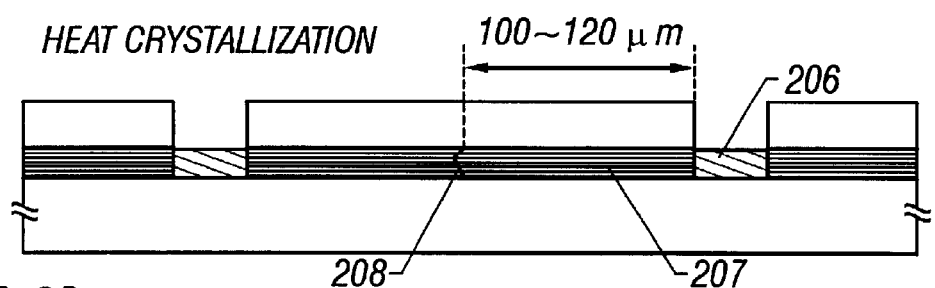

Next, in an inert gas atmosphere or in an atmosphere containing hydrogen, a heat treatment at a temperature of 500 to 700° C. typically 550 to 650° C. for 4 to 8 hours is carried out to crystallize the amorphous silicon film 202. It is conceivable that the crystallization is progressed with nuclei of nickel (FIG. 2C).

The crystallization of the amorphous silicon film 202 is progressed from the opening 204 in which nickel was added, with priority, and a first crystal region 206 is formed under the opening 204. Further, by diffusion of nickel, a second crystal region 207 constituted by rod-shaped or flattened rod-shaped crystals grown in substantially parallel to the substrate 201 is formed under the mask 203. Reference numeral 208 denotes a grain boundary formed by collision of the second crystal regions 207 grown from the opposite directions to each other.

In the present invention, only the second crystal region is used as a crystalline silicon film. That is, the position of the crystallized region (second crystal region 207) of the amorphous silicon film 202, the grain boundary 208 formed by collision and the like can be controlled by the arrangement of the opening 204, so that it is possible to avoid the situation that the crystal grain boundary affects the TFT characteristics like a conventional polysilicon film.

Figure 2D:
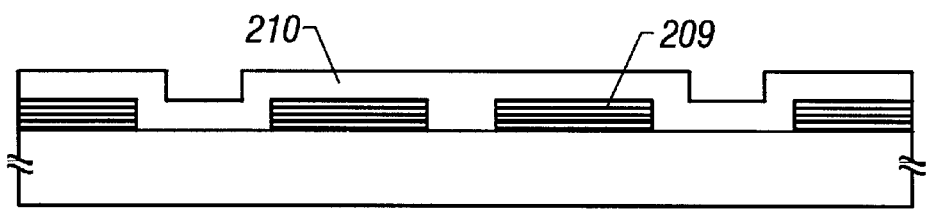

Next, after the mask 203 of the silicon oxide film is removed, the thus obtained crystal silicon film 207 is patterned into an island shape to form a plurality of active layers 209 as shown in FIG. 2D.

After the active layers 209 made of crystalline silicon films are formed, a gate insulating film 210 made of a silicon oxide film is grown on the active layers 209. The gate insulating film 210 is crown by a vapor phase method such as a plasma CVD method, a thermal CVD method, or a sputtering method. Instead of the silicon oxide film, a silicon nitride film, a silicon nitride oxide film, or a laminated film thereof may be used.

The film thickness of the gate insulating film 210 may be determined according to an object (circuit and the like) of using TFTs, that is, according to required characteristics. Incidentally, in the case where the thickness of the finally required gate insulating film is not larger than 500 Å, it is also possible to take such a way that the gate insulating film 210 is not grown but only a thermal oxidation film obtained in a later thermal oxidation step is used as the gate insulting film.

Next, a heat treatment is carried out in an atmosphere containing a halogen element. This heat treatment is a gettering process of the catalytic element, and has a primary object to remove a metal element (especially nickel) in the active layers 209 by using the gettering effect of the metal element with the halogen element.

The heat treatment for gettering is preferably carried out at a temperature exceeding 700° C. in order to obtain the effect. If the temperature is lower than the value, there is a fear that a sufficient gettering effect is not obtained since the gate insulating film 210 becomes a blocking layer.

Thus, this heat treatment is carried out at a temperature exceeding 700° C., preferably 800 to 1000° C. (typically 950° C.), and when a processing time is 0.1 to 6 hours, typically 0.5 to 1 hour, the sufficient gettering effect can be obtained.

Here, there will be described an example in which a heat treatment is carried out at a temperature of 950° C. for 30 minutes in an atmosphere containing hydrogen chloride (HCl) of 0.5 to 10 vol % (3 vol % in this embodiment) with respect to an oxygen ($O_2$) atmosphere. If the concentration of HCl is more than the above, since unevenness comparable to the film thickness is produced on the surface of the active layer 209, it is not preferable.

If the atmosphere is changed by mixing a high concentration of nitrogen ($N_2$) into the above described oxidizing atmosphere, it is possible to lower the oxidation rate of the crystalline silicon film. This is an effective means for the case where a gettering time is increased without progressing a thermal oxidation reaction more than necessity.

Although HCl as is used as a compound containing the halogen element, one kind or plural kinds of compounds selected from the group typically consisting of HF, $NF_3$, HBr, $Cl_2$, $ClF_3$, $BCl_3$, $F_2$, Br, may be used other than the HCl gas. Also, a hydroxide of halogen or an organic material (carbon hydroxide) of halogen may be generally used.

It is considered that in this step, nickel added into the active layers 209 are gettered by the function of the halogen element (here chlorine) to be changed into volatile nickel chloride which escapes into the air so that the nickel is removed. Thus, the concentration of nickel in the active layer 211 is decreased to $1 \times 101_7$ atoms/$cm^3$ or less. Incidentally, the impurity concentration in the present specification is defined as the minimum value of measurement values obtained by SIMS analysis.

Figure 2E:
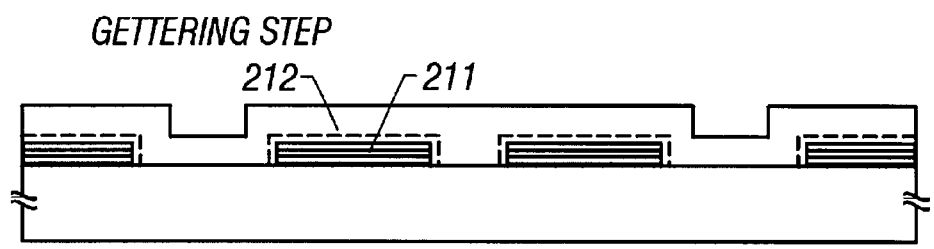

Thus, by the heat treatment in an atmosphere containing the halogen element shown in FIG. 2E, the concentration of nickel in the active layer 211 is lowered to a level ($1 \times 10^{17}$ atoms/$cm^3$ or less, preferably spin density in the active layer or less) which does not affect the device characteristics, so that the active layer having an extremely small trap density can be obtained.

When the gettering step has been carried out, the halogen element, which was used for the gettering process, with a concentration of $1 \times 10^{15}$ to $1 \times 10^{20}$ atoms/$cm^3$ remains in the active layer 209. At that time, it is confirmed by the SIMS analysis that the halogen element tends to be distributed with high concentration between the active layer 209 and a thermal oxidation film formed by the heat treatment.

Figure 3:
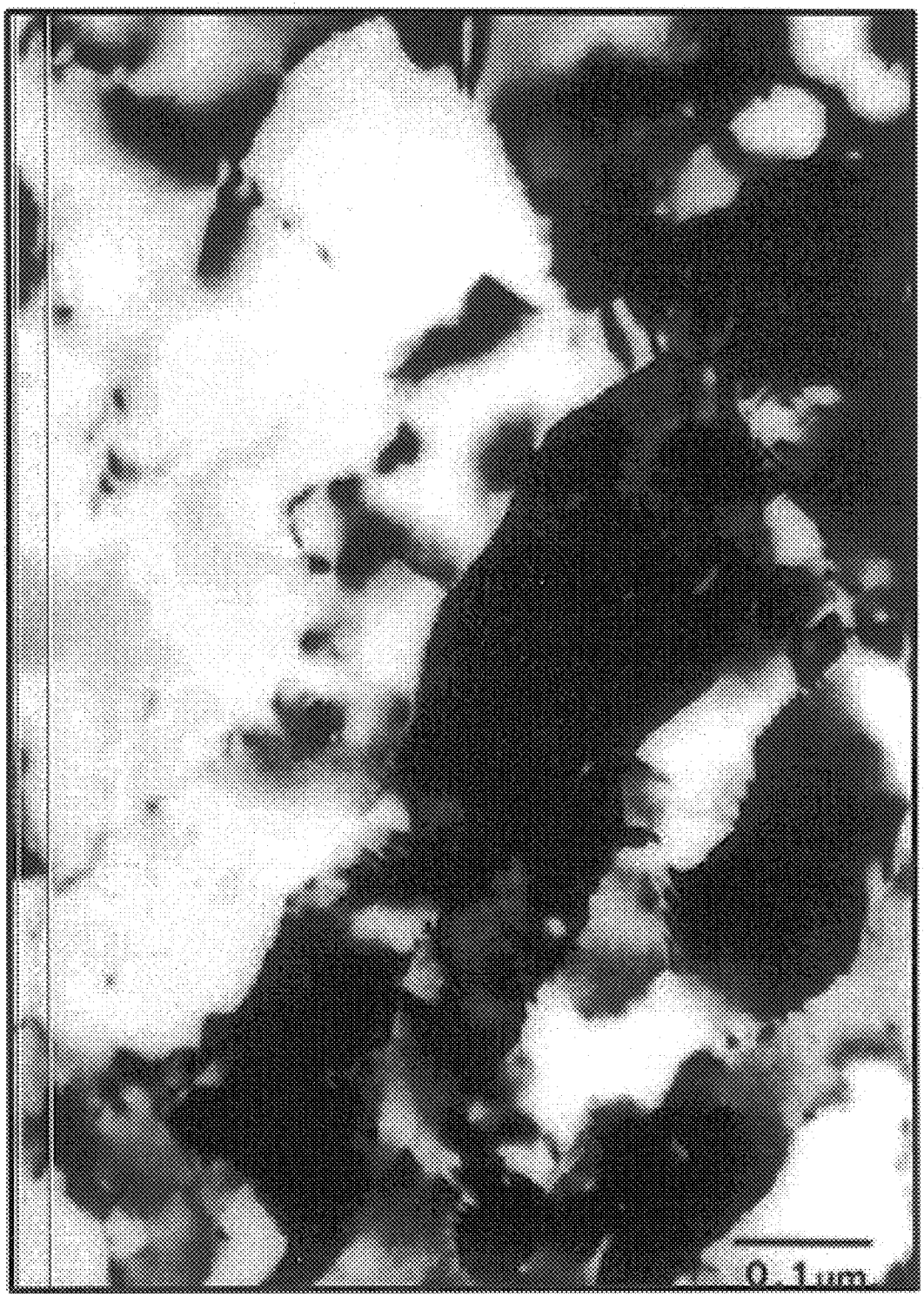
FIG. 3 is a TEM photograph showing a crystal structure of the silicon thin film.

The active layer 21 obtained by the above described steps is constituted by a crystalline silicon film having a unique crystal structure body. FIG. 3 is a TEM photograph of a silicon film formed in accordance with the above steps, which is enlarged by a factor of 25 thousands. As shown in FIG. 3, the crystalline silicon film obtained by the above steps has the following features.

(1) The structure of crystal lattices is such that the lattices are continuously connected to each other in an almost specific direction.

(2) Thin rod-shaped (or column-shaped) crystals or thin flattened rod-shaped crystals are grown.

(3) The plurality of rod-shaped or flattened rod-shaped crystals are grown in parallel or substantially in parallel to each other. and with directionality.

When seeing the photograph shown in FIG. 3, it is confirmed that for example, a rod-shaped crystal with a narrow width of about 0.15 μm extends in the oblique direction from the lower left to the upper right, and definite boundaries (crystal grain boundaries) exist at both ends of the width (linear shades seen in the photograph are due to the difference of directions of crystal faces). Also, it is confirmed that since a plurality of rod-shaped crystals grow in the direction substantially parallel to each other, a plurality of crystal train boundaries also extend substantially in parallel. Since these crystal grain boundaries become energy barriers for a carrier (electron or hole), it is conceivable that the carrier moves in only the inside of the rod-shaped crystal with priority.

The crystallinity of the active layer 211 is extremely improved by the heat treatment at a temperature exceeding 700° C. in an atmosphere containing the halogen element, and the metal element is removed by gettering so that the metal element does not cause any problem. Thus, it is conceivable that crystal lattices are continuously connected in the inside ot the rod-shaped crystal and the inside has become a region regarded as substantially a single crystal for carriers.

The state that the crystal lattices are continuously connected to each other means that crystal grain boundaries do not substantially exist in the inside of the rod-shaped crystal, or even if they exist, they are electrically inactive. The present inventors infer from the result of electrical characteristics (described later) of a TFT using the active layer 211 that even if the crystal rain boundaries exist, there is a high possibility that the grain boundaries are electrically inactive rain boundaries such as {111} twin grain boundaries, {111} lamination defects, and {221} twin grain boundaries.

By the above heat treatment, a thermal oxidation reaction progresses in the interface between the active layer 211 and the gate insulating layer 210, and the total film thickness of the gate insulating film 210 is increased by a formed thermal oxidation film 212. Thus, the active layer 211 is made thin in proportion to the formation of the thermal oxidation film. Thinning a film of the active layer promotes such effects as lowering of off-current of a TFT and improvement of a field effect mobility. Further, after the heat treatment is carried out in the halogen atmosphere, when a heat treatment at 950° C. for about one hour is carried out in a nitrogen atmosphere, the film quality of the gate insulating film 210 is improved, and an extremely superior semiconductor/insulating film interface can be realized.

(TFT Required in the Present Invention)

Figure 4:
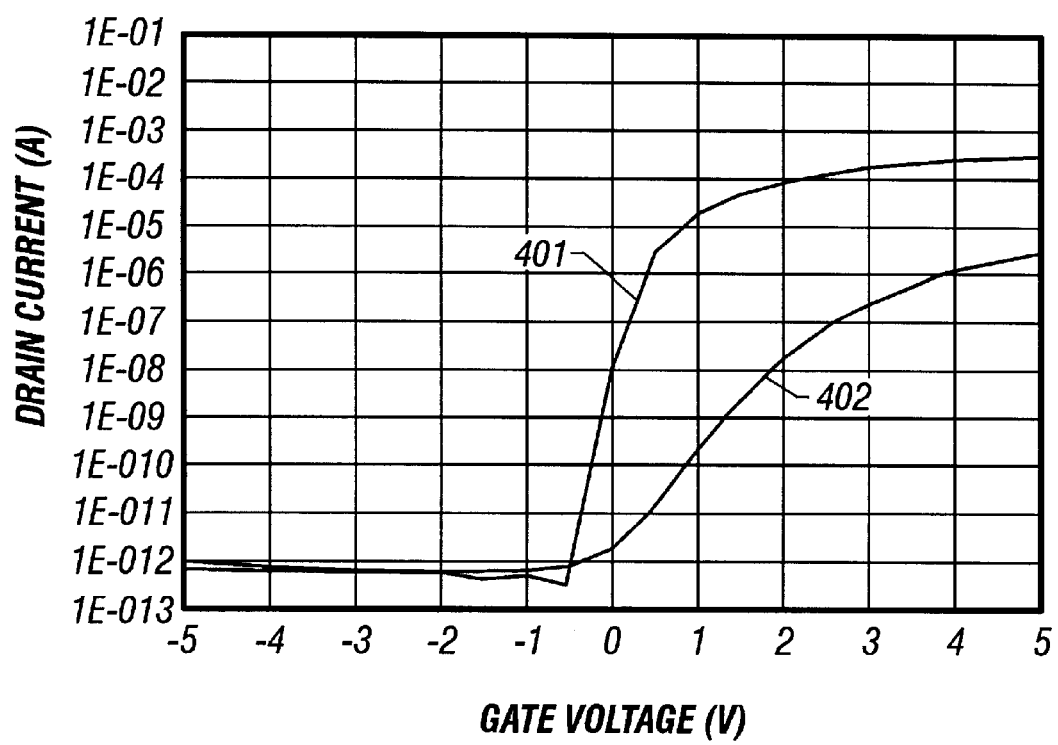
FIG. 4 is a view showing electrical characteristics of TFTs.

When a TFT is formed by using the above active layer 211, electrical characteristics as shown in FIG. 4 are obtained (manufacturing steps of the TFT will be described in a later embodiment). FIG. 4 shows plotted Id-Vg curves (Id-Vg characteristics) of N-channel TFTs in which the horizontal axis indicates a gate voltage (Vg) and the vertical axis indicates a logarithm of a drain voltage (Id).

In FIG. 4, reference numeral 401 denotes electrical characteristics of a TFT using the active layer obtained in the abode step, and 402 denotes electrical characteristics of a conventional TFT. Specifically, 402 denotes electrical characteristics of the TFT fabricated by a process in which the heat treatment in the atmosphere containing the halogen element and the later nitrogen annealing step are removed from the above described steps.

When the characteristics of both transistors are compared with each other, it is confirmed that even at the same gate voltage, an on-state current in the characteristics 401 is larger than that of the characteristics 402 by a factor of about two to four digits. The on-state current is a drain current flowing when the TFT is in an on-state (in a range where the gate voltage is about 0 to 5 in FIG. 4).

Also, it is confirmed that the characteristics indicated by 401 have a superior subthreshold characteristic. The subthreshold characteristic is a parameter indicating the steepness of a switching operation of a TFT, and it may be said that when a TFT is switched from an off-state to an on-state, the steeper the rising of the Id-Vg curve is, the better the subthreshold characteristic is.

When the TFT of the present invention is compared with the conventional TFT in typical electrical measurement data, it is confirmed the following.

(1) The subthreshold coefficient of the characteristics 402 is about 350 mV/decade, while the subthreshold coefficient of the characteristics 401 is about 80 mV/decade. As the value becomes small. a TFT becomes superior in switching performance.

(2) The field effect mobility of the characteristics 402 is about 80 cm$^2$/Vs, while the mobility of the characteristics 401 is large to be about 250 cm$^2$/Vs. As the field effect mobility becomes large, the operating speed becomes high, that is, high frequency driving is possible.

As described above, the TFT of the present invention has extremely superior switching characteristics and high speed characteristics, and can operate at such high speed that the logic circuit 105 as shown in FIG. 1 can be formed. That is, in order to realize the active matrix display as shown in FIG. 1 in which a high frequency driving circuit and a low frequency driving circuit are systematized, the TFT of the present invention which can operate in a wide range of driving frequency is necessary.

Also, the above TFT has a feature that the difference of electrical characteristics between an N-channel TFT and a P-channel TFT is small. For example, according to a result of measurement of samples made by the present inventors experimentally, a threshold voltage was –0.5 to 1.5 V for an N-type TFT, and –1.5 to 0.5 V for a P-type TFT. The subthreshold coefficient (S value) was 60 to 100 mV/decade (typically 60 to 85 mV/decade) for both N-type TFT and P-type TFT. The average field effect mobility ($\mu_{FE}$) was 200 to 250 cm$^2$/Vs for an N-type TFT and 150 to 200 cm$^2$/Vs for a P-type TFT.

As described above, in the above TFT invented by the present inventors, the performance of the N-channel TFT is substantially equal to that of the P-channel TFT. Thus, even if a CMOS structure is constituted, the occurrence of an erroneous operation and lowering of an operating speed due to the unbalance of operation performance is not caused. That is, the extremely high TFT characteristics can be utilized as they are.

In this respect, according to the measurement result of nine-stage ring oscillator formed by the present inventors experimentally by using the TFTs of the present invention, oscillation frequencies of about 450 MHz at a power source voltage 3.3 V, and about 540 MHz at 5.0 V were recorded. These values mean that a high speed operation higher than a reference ring oscillator constituted by conventional TFTs by a factor of twenty to thirty is realized.

Here, there is a feature to be noted in the TFT of the present invention. That is, it has been described that if a channel length is shortened to raise an operating speed of a conventional TFT, the characteristics of the TFT are deteriorated by the short channel effect. However, although the channel length of the TFT of the present invention is short to be 2 μm, the TFT has an extremely high operating speed and high drain withstand voltage, and it has been confirmed by estimation through an accelerating test that the TFT is highly reliable.

The present inventors infer that the silicon thin film of the present invention, which is made of the unique crystal structure body, effectively suppress the short channel effect by the reason based on the structure. Incidentally, the short channel effect is a general term for the drop of threshold voltage, deterioration of drain withstand voltage, deterioration of subthreshold characteristic and the like, which are caused by shortening a channel length. The short channel effect is basically caused by a punch-through phenomenon generated by extension of a depletion layer at the drain region side into the source region. The details of the short channel effect may be referred to "PHYSICS OF VLSI DEVICE; Mitsumasa Koyanagi et al; Maruzen; 1986".

Figure 5A:
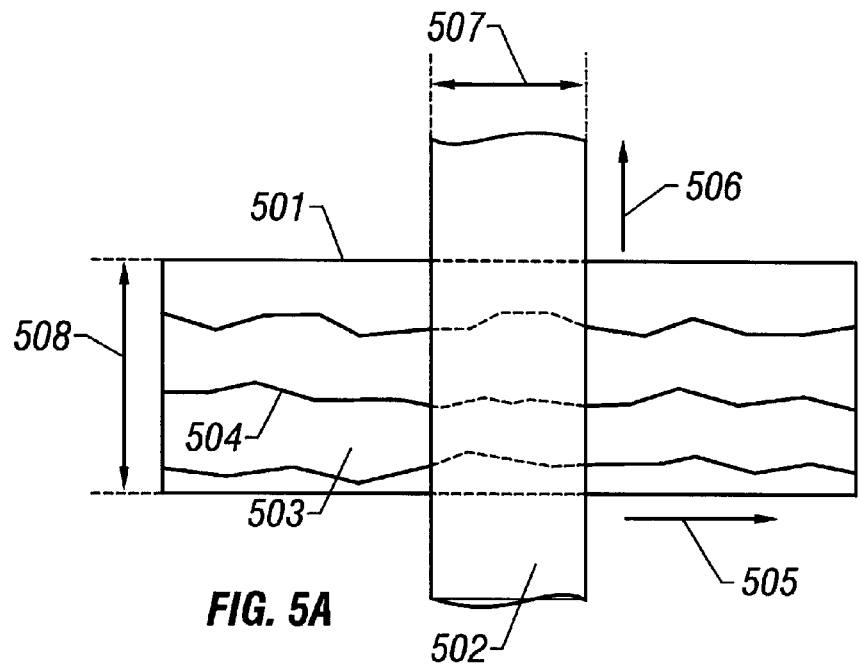
FIGS. 5A to 5C are views showing the structure of a TFT.

FIG. 5A is a view showing the vicinity of an active layer or a TFT seen from the above. In FIG. 5A. 501 denotes an active layer, and 502 denotes a ate electrode. The active layer 501 is constituted by a plurality of rod-shaped crystals 503 and crystal grain boundaries 504. The active layer 501 functions in the structure of source region/channel formation region/drain region.

An arrow 505 indicates a direction (direction substantially parallel to the crystal grain boundary 504) in which a carrier moves. which is defined as a channel length direction. An arrow 506 indicates a direction (direction substantially perpendicular to the crystal grain boundary 504) perpendicular to the channel length direction, which is defined as a channel width direction. Further, a length 507 is defined as a channel length (L), and a width 508 is defined as a channel width (WV).

The channel length is substantially equal to the line width of the gate electrode 502. However, when the gate electrode 502 includes a region which does not substantially function as an electrode, for example, when an anodic oxidation film is formed on the surface of the ate electrode 502, the channel length is not necessarily equal to the line width.

The present inventors have attached importance to the effect of the crystal rain boundaries 504 in FIG. 5A as the reason why the drain withstand voltage of the TFT of the present invention is high. That is, the present inventors have inferred that in the channel formation region, energy barriers due to the crystal rain boundaries 504 existing in substantially parallel to the channel length direction 505 effectively suppress the extension of a depletion layer from the drain region so that the punch-through phenomenon is prevented from occurring.

Figure 5B:
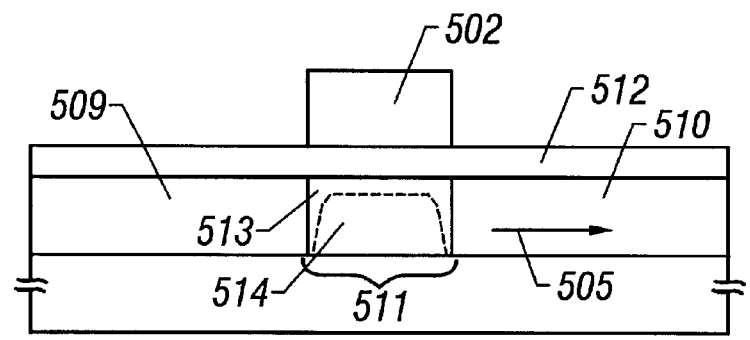

FIG. 5B schematically shows the state. FIG. 5B is a sectional view of FIG. 5A taken in the channel length direction. In FIG. 5B, 509 denotes a source region, 510 denotes a drain region, 511 denotes a channel formation region, 512 denotes a gate insulating film, and 513 denotes a depletion layer. The present inventors infer that the depletion layer 513 is suppressed from progressing into the inside of the rod-shaped crystal 503 by the energy barrier due to the crystal grain boundary 504 and can not intrude into the inside (region 514) of the channel formation region 511.

That is, it is conceivable that even in such a state that the influence of the short channel effect become tangible in a TFT using a conventional silicon thin film, that is, in a submicron (0.01 to 2 μm) region where the channel length 507 is extremely small, the extension of the depletion layer can be suppressed as shown in FIG. 5B, so that the short channel effect can be effectively suppressed.

Figure 5C:
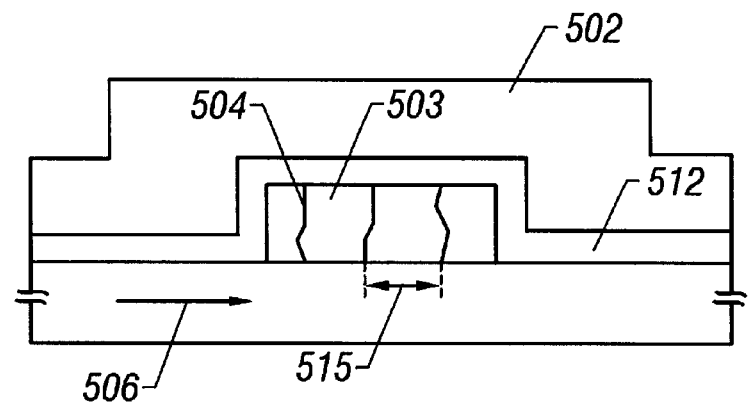

FIG. 5C is a sectional view of FIG. 5A taken in the channel width direction. As shown in FIG. 5C, the active layer 501 is constituted by the plurality of rod-shaped crystals 503 arranged side by side, and the channel formation region is made of a group of the plurality of intrinsic or substantially intrinsic rod-shaped crystals 503. That is, each of the plurality of rod-shaped crystals 503 can be regarded as a fine channel formation region having crystal grain width "d" (denoted by 515). Thus, the present inventors infer that a narrow channel effect occurs in each of the rod-shaped crystals 503.

The narrow channel effect is a phenomenon that when a channel width becomes narrow, a threshold voltage of a TFT is increased. In the silicon thin film of the present invention, it is conceivable that the drop of a threshold voltage due to the short channel effect is offset by the narrow channel effect generated in each of the narrow rod-shaped crystals.

In the narrow channel effect, a threshold voltage is totally increased by the existence of high energy barrier region at ends of the channel formation region. In a thin film, it is conceivable that the narrow channel effect occurs in two directions of the horizontal direction and vertical direction with respect to the substrate. Thus, carries actually move in low energy barrier regions with priority.

With respect to the movement of carriers, in the silicon thin film of the present invention, the behavior of carriers is different between carriers moving in parallel to the crystal grain boundary 504 and carriers moving perpendicularly thereto. That is, the silicon thin film has a feature of anisotropy. For example, if the direction of movement of carriers substantially coincides with the channel length direction 505, it is very effective in improving the field effect mobility of the TFT. It is conceivable that the reason is as follows.

The field effect mobility of a TFT is determined by the scattering of carriers in a silicon film. The scattering is roughly divided into a lattice scattering and an impurity scattering. At this time, in a temperature range used in everyday life, especially the influence of the impurity scattering become dominant. The present invention has the following advantages against this scattering.

(1) Since the inside of the column-shaped crystal in which carriers move, is a region regarded as substantially a single crystal, and is intrinsic or substantially intrinsic, it may be considered that there is no impurity to block the movement of carriers.

(2) In the state as shown in FIG. 5A, the crystal grain boundary 504 functions as an energy barrier to regulate the direction of movement of carriers to almost the same direction as that of extension of the rod-shaped crystal 503, so that a possibility of scattering due to collision among the carriers is decreased.

In the above advantage (1), that the region is intrinsic or substantially intrinsic means to satisfy at least one of the following conditions.

1) An activation energy of the silicon film is about ½ (Fermi level is positioned at almost the center of a forbidden band).

2) An impurity concentration in the region is lower than the spin density.

3) It is an undoped region in which an impurity is not intentionally added.

4) It is an intrinsic region.

For example, in a TFT using a conventional silicon thin film, channel doping is a general means for suppressing the short channel effect. However, the means increases the impurity concentration in the channel formation region to block the movement of carriers, so that the operating speed (field effect mobility) of the TFT is deteriorated. On the other hand, as described above, in the TFT of the present invention, the silicon film itself has the effect to suppress the short channel effect, so that the intrinsic or substantially intrinsic channel formation region can be formed.

On the contrary, since the crystal grain boundary 504 becomes an energy barrier to block the movement of carriers, the mobility of carriers moving in the direction perpendicular (channel width direction) to the rain boundary becomes extremely small.

As described above, it is conceivable that by suppressing the extension of the drain side depletion layer, it is possible to prevent the short channel effect. Also, by preventing the short channel effect, it is possible to expect the improvement of a subthreshold characteristic in addition to the improvement of a drain withstand voltage. The improvement of the subthreshold characteristic can be explained as follows from the inference that it is possible to decrease the volume occupied by the drain side depletion layer by using the structure of the present invention.

The present inventors infer that as shown in FIG. 5B, the extension of the depletion layer is effectively suppressed so that the volume occupied by the drain side depletion layer can be decreased to a large degree. Thus, it is conceivable that since a total depletion layer charge can be made small, the capacitance of the depletion layer can be made small. An equation for obtaining a subthreshold coefficient S is expressed by the following approximate equation.

$$S = \ln 10 \cdot kT/q[1+(Cd+Cit)/Cox] \tag{1}$$

In the equation (1), k is the Boltzman constant, T is the absolute temperature, q is an amount of charge, Cd is depletion layer capacitance, Cit is equivalent capacitance of an interfacial level, and Cox is gate oxidation film capacitance. Thus, in the structure of the present invention, the TFT having an ideal state of Cd=Cit=0, that is, having an S value of 60 mV/decade can be realized by making the depletion layer capacitance Cd and the equivalent capacitance Cit of the interfacial level as small as possible.

The above is merely the inference derived by connecting the silicon thin film made of the unique crystal structural body actually obtained by the present inventors with the electrical characteristics of the TFT actually fabricated experimentally by using the silicon thin film.

However, the experimental data is true, and the TFT of the present invention has superior performance quite different from the TFT using a conventional silicon thin film as described before.

By the TFT having the electrical characteristics and effects as described in this embodiment, a circuit capable of operating at both high frequency driving and low frequency driving can be first constituted on the same substrate without requiring specific means such as channel doping. That is, by obtaining the silicon thin film described in this embodiment, it has become possible to constitute the active matrix display as shown in FIG. 1.

[Embodiment 2]

Figure 6A:
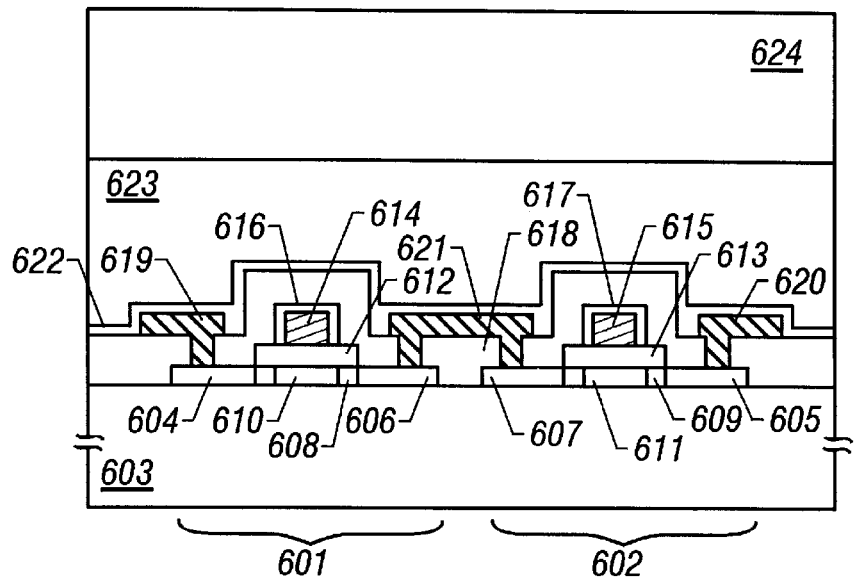
FIGS. 6A and 6B are views showing the sections of a CMOS structure and a pixel region, respectively.
Figure 6B:
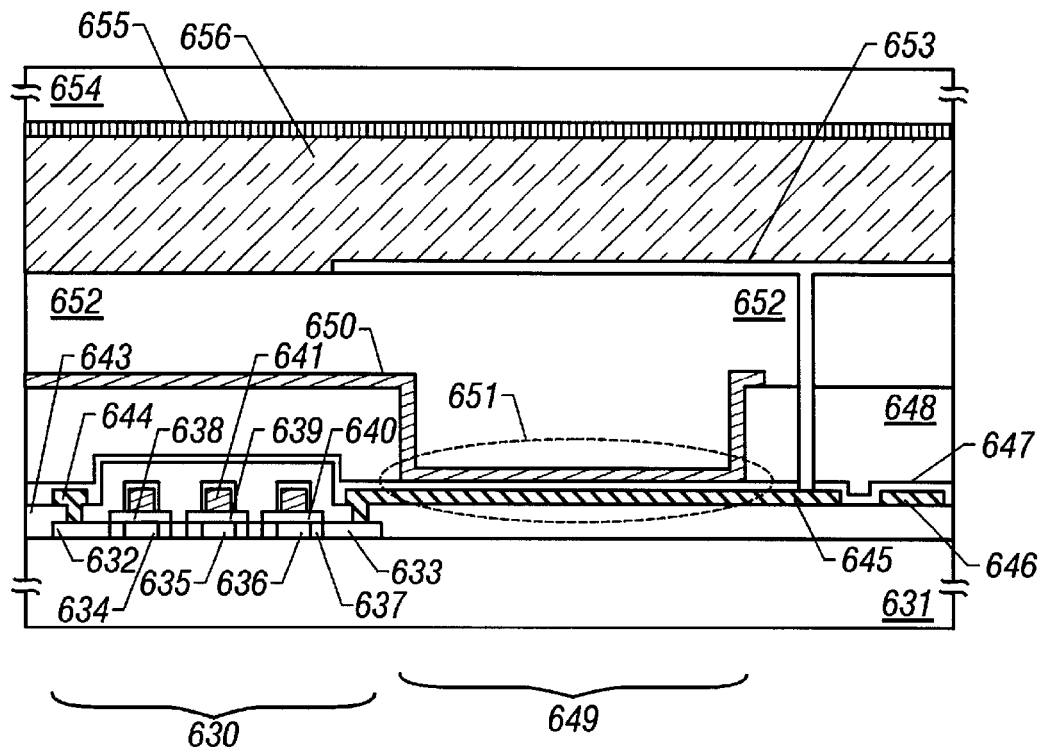

In reference to this embodiment, FIG. 6A is a sectional view showing a CMOS structure as a basic structure for constituting the source line driver circuit 103, the gate line driver circuit 104, and the logic circuit 105 in the active matrix display shown in FIG. 1. FIG. 6B is a sectional view showing the pixel TFT 111 and the pixel region 110 constituting the pixel matrix circuit 102. Incidentally, the structure shown in this embodiment is merely one example, and does not limit the present invention.

First, a CMOS structure in which an N-channel TFT 601 and a P-channel TFT 602 are complementarily combined with each other, will be described. The N-channel TFT 601 and the P-channel TFT 602 have substantially the same structure.

In FIG. 6A, 603 denotes a quartz substrate, 604 and 606 denote respectively a source region and a drain region of the N-channel TFT. and 605 and 607 denote respectively a source region and a drain region of the P-channel TFT. Reference numerals 608 and 609 denote respectively a pair of low concentration impurity regions disposed in the N-channel TFT and P-channel TFT, and 610 and 611 denote respectively channel formation regions of the N-channel TFT and P-channel TFT.

Reference numerals 612 and 613 denote gate insulating films. and 614 and 615 denote gate electrodes. Dense anodic oxidation films 616 and 617 obtained by anodic oxidation of the gate electrodes are formed on the upper surfaces and side surfaces of the gate electrodes 614 and 615.

Reference numeral 618 denotes a first interlayer insulating film, 619 and 620 denote source lines, and 621 denotes a drain line. A second interlayer insulating film 622, a third interlayer insulating film 623, and a fourth interlayer insulating film 624 are formed thereon.

At this time, since the second interlayer insulating film 622 becomes an insulator for constituting an auxiliary capacitance in the pixel region, it is preferable to constitute the film by a silicon nitride film, a silicon oxide film, or a laminated film thereof. Also, it is preferable to constitute the third interlayer insulating film 623 and the fourth interlayer insulating film 624 by an organic resin material (for example, polyimide, acryl, etc.) having a low relative dielectric constant and capable of being easily flattened for decreasing parasitic capacitance and for obtaining a flattened effect.

Next, the sectional structure of the pixel region 110 and the pixel TFT 111 in FIG. 1 will be described with reference to FIG. 6B. Since the CMOS structure shown in FIG. 6A and the pixel TFT 630 shown in FIG. 6B are integrally formed on the same substrate, the same layer is basically formed of the same material.

This embodiment shows an example adopting a triple gate TFT having a structure in which substantially three N-channel TFTs each constituted by one gate electrode are connected in series to each other.

In FIG. 6B, 631 denotes a quartz substrate, 632 denotes a source region, 633 denotes a drain region, 634 to 636 denote channel formation regions. Although a pair of low concentration impurity regions 637 are disposed at both ends of the respective channel formation regions 634 to 636, since the basic structure of an active layer is the same between the single gate TFT shown in FIG. 6A and the triple gate TFT shown in FIG. 6B, the detailed description thereof will be omitted. Of course, the active layer shown in FIG. 6B is formed at the same time as the active layer of the N-channel TFT shown in FIG. 6A.

Reference numeral 638 to 640 denote gate insulating films. which are formed at the same time as the gate insulating films 612 and 613 in FIG. 6A. Reference numeral 641 denotes a gate electrode, 642 denotes a dense anodic oxidation film formed by anodic oxidation of the gate electrode. Although it appears that there are three gate electrodes 641, they are actually the same wiring line. The gate electrode 641 and the anodic oxidation film 642 are respectively formed at the same time as the gate electrodes 614 and 615 and the anodic oxidation films 616 and 617 in FIG. 6A.

Reference numeral 643 denotes a first interlayer insulating film, 644 denotes a source line, 645 denotes a connection wiring line. and 646 denotes another source line adjacent to the source line 644. The source lines 644 and 616, and the connection line 645 are constituted by the same layers as the source lines 619 and 620, and the drain line 62 1 in FIG. 6A. In the structure of this embodiment, the connection wiring line 651 is formed a little long as shown in FIG. 6B to increase the area of an auxiliary capacitor formed later (increase the capacitance).

Reference numeral 647 denotes a second interlayer insulating film, and 648 denotes a third interlayer insulating film. The respective interlayer insulating films 647 and 648 are formed at the same time as the second interlayer insulating film 622 and the third interlayer insulating film 623 in FIG. 6A. The third interlayer insulating film 648 at a region 649 is removed, and a black matrix 650 is formed thereon. Thus, in the region 649, an auxiliary capacitor 651 formed of laminated structure of the connection wiring line 645, the second interlayer insulating film 647 and the black matrix 650 are formed.

If the auxiliary capacitor 651 is made to have the structure as shown in FIG. 6B, since the capacitance of the auxiliary capacitor is determined by the second interlayer insulating film 647, the capacitance can be increased by using a material having a high relative dielectric constant or by thinning the film thickness. For example, it is preferable that the second interlayer insulating film 647 is made of an insulating film having a high relative dielectric constant. Also, it is suitable that the film thickness thereof is 100 to 300 Å.

However, in order to form the auxiliary capacitor 651 the third interlayer insulating film 648 must be removed while leaving only the second interlayer insulating film 647 in the region 649, so that the second and third interlayer insulating films must be selectively etched. In such a sense, as the second interlayer insulating film 647, a silicon oxide film or a laminated film of a silicon oxide film and a silicon nitride film is effective.

Next, the black matrix 650 is covered with a fourth interlayer insulating film 652, and a pixel electrode 653 is formed thereon. At this time, the pixel electrode 653 is electrically connected to the drain region 633 through the connection wiring line 645. Thus, the auxiliary capacitor 651 can be regraded as a capacitor connected to the pixel electrode 653 in series. The fourth interlayer insulating film 652 is in the same layer as the fourth interlayer insulating film 624 in FIG. 6A.

A substrate 654 is an opposite substrate on which an opposite electrode 655 is formed. A liquid crystal layer 656 is held by bonding the active matrix substrate 631 to the opposite substrate 654 so that the liquid crystal cell 112 in FIG. 12 is formed.

Figure 7:
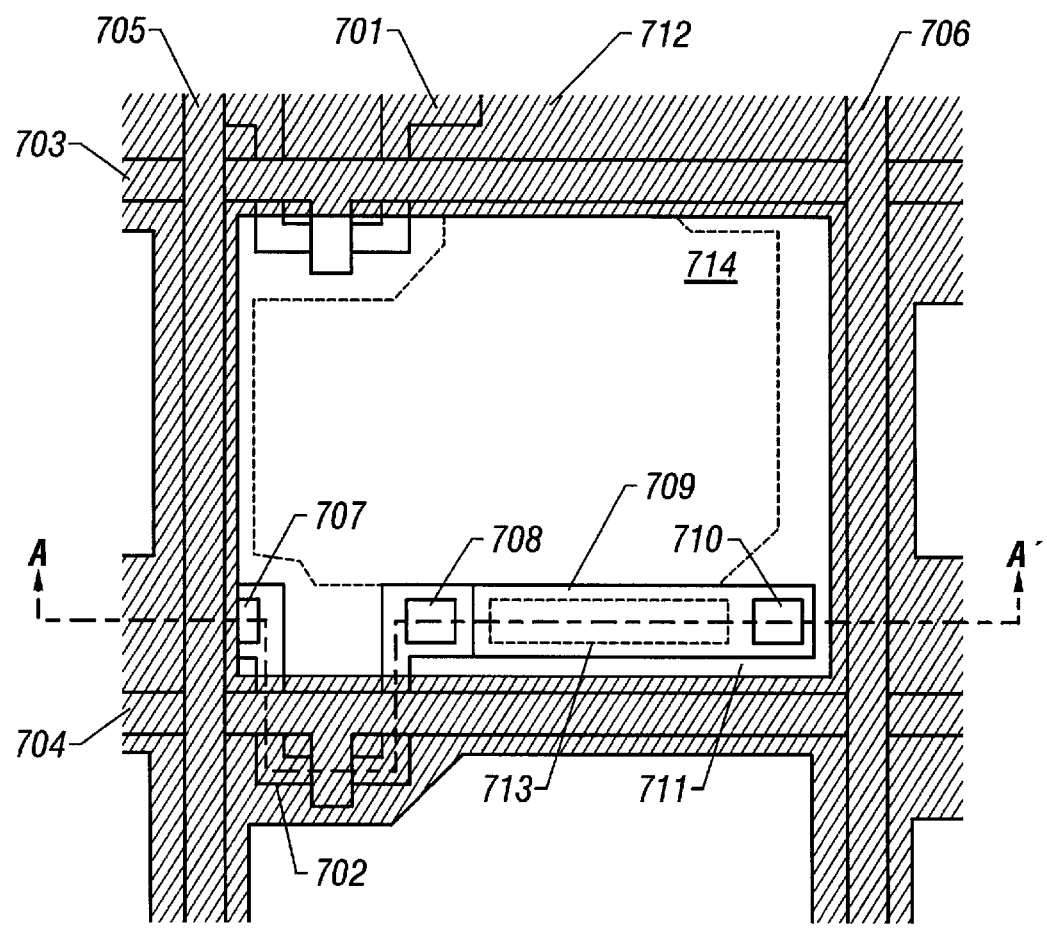
FIG. 7 is a view showing a pixel region seen from the above.

FIG. 7 is a top view showing the pixel region 110. Although upper layers (liquid crystal layer, opposite substrate, etc.) than a pixel electrode 714 are not shown in FIG. 7, FIG. 6B basically corresponds to a sectional view taken along a dotted line A–A' of FIG. 7.

In FIG. 7, 701 and 702 denote active layers, 703 and 704 denote gate lines, and 705 and 706 denote source lines. In practice, the plurality of source lines and gate lines are arranged to perpendicularly intersect with each other, and a plurality of regions which are surrounded by the source lines and the gate lines and are arranged in matrix, function as the pixel regions 10 in FIG. 1. The gate line 704 corresponds to the gate electrode 641 in FIG. 6B, and the source lines 705 and 706 correspond respectively to the source lines 644 and 646 in FIG. 6B.

The ate line 704 is overlapped at three portions above the active layer 702. That is, the triple gate TFT having the same structure as three pixel TFTs connected in series to each other is formed. Of course, although the triple gate TFT is shown as an example, a single gate TFT may be used.

The gate wiring lines 705 and 706 may be disposed in the layer lower than the active layers 701 and 702 to form a structure like a reverse stagger type TFT. In this case, it is preferable to use a material having high heat resistance, such as a polysilicon film, for a gate electrode so that the gate electrode can withstand such a heat treatment as in FIG. 2E, which is carried out in the manufacturing steps of the silicon thin film.

Reference numeral 707 denotes a contact portion of the active layer 702 (source region 632) and the source line 705, 708 denotes a contact portion of the active layer 702 (drain region 633) and the connection wiring line 709, and 710 denotes a contact portion of the connection wiring line 709 and the pixel electrode 711. The connection wiring line 709 corresponds to the connection wiring line 645 in FIG. 6B.

A region indicated by oblique lines 712 is the black matrix 650 in FIG. 6B, and is formed to shade the active layers 701 and 702, the gate wiring lines 703 and 704, and the source lines 705 and 706. The black matrix 712 overlaps with the connection wiring line 709 at a region 713 (the region 649 in FIG. 6B), so that an auxiliary capacitor is formed between the black matrix and the connection wiring line 709.

A pixel electrode 711 (corresponding to the pixel electrode 653 in FIG. 6B) is disposed on the black matrix 712 through the second interlayer insulating film 652. The pixel electrode 714 is structured so that the edge portion thereof is shaded by the black matrix 712 without fail, and the region 714 which does not overlap with the black matrix 712 becomes an image display region for forming an image. Actually, as shown in FIG. 6B, the opposite substrate 654, the opposite electrode 655, and the liquid crystal layer 656 are disposed above the pixel electrode 711 to constitute the liquid crystal cell 112.

Next, manufacturing steps of forming the CMOS structure shown in FIG. 6A and the pixel region shown in FIG. 6B on the same substrate will be described with reference to FIGS. 8 and 9. In order to clarify the correspondence, reference numerals used in FIGS. 6A and 6B will be also used according to necessity.

First, by the steps shown in the embodiment 1, active layers 802 to 804 made of the silicon thin films of the present invention, and a first insulating film 805 as an original film of a later formed ate insulating film are formed on a quartz substrate 801. At this time, the active layer 802 becomes an active layer of the N-channel TFT 601, the active layer 803 becomes an active layer of the P-channel TFT 602, and the active layer 603 becomes an active layer of the pixel TFT 630 (FIG. 8A).

The steps from the formation of a ate electrode to ion implantation described below are based on the technique disclosed in Japanese Patent Unexamined Publication No. Hei. 7-135318 by the present inventors et al. Thus, detailed conditions and the like may be referred to the publication.

After a pattern made of a material containing mainly aluminum is formed above the active layers 802 to 804, porous anodic oxidation films 806 to 808 and dense anodic oxidation films 616, 617 and 642 are formed by two anodic oxidation steps. After the anodic oxidation steps, the gate electrodes 614, 615 and 641 are defined. As described above, since the pixel TFT 630 is the triple gate TFT of the structure as shown in FIG. 7, the gate electrode 641, the porous anodic oxidation film 808 and the dense anodic oxidation film 642 are common to all three patterns shown in the drawing.

After the state shown in FIG. 8B is obtained in this way, dry etching of the first insulating film 805 is carried out by using the gate electrode and the porous anodic oxidation film as masks, so that the gate insulating films 612, 613, 638 to 640 are formed.

Then the porous anodic oxidation films 806 to 808 are removed, and high acceleration P ion implantation and low acceleration P ion implantation are carried out. By this step, the source region 604. the drain region 606, the low concentration impurity region (also called LDD region) 608 and the channel formation region 610 of the N-channel TFT 601 are formed. Also, the source region 632, the drain region 633, the low concentration impurity region 637 and the channel formation regions 634 to 636 of the pixel TFT 630 (N-channel type) are formed.

At this time, P ions are also added into the active layer of the P-channel TFT 602 so that there are formed regions 809 and 810 containing P ions of a concentration comparable to the above source region 604 and the drain region 606, and a region 811 containing P ions of a concentration comparable to the above low concentration impurity region 608.

Next, a resist mask 812 is provided so that only the P-channel TFT 602 is exposed, and high acceleration B ion implantation and low acceleration B ion implantation are carried out. By this step, all the regions 809 to 811 containing P ions in FIG. 8C are inverted into a P-type, so that the source region 605, the drain region 607, the low concentration impurity region 609 and the channel formation region 611 of the P-channel TFT 602 are formed (FIG. 8D).

When the above ion implantation steps are used, it is possible to form the active layer of the N-channel TFT and the active layer of the P-channel TFT on the same substrate only by one patterning step. Especially, since this embodiment uses the technique disclosed in Japanese Patent Unexamined Publication No. Hei. 7-135318 in combination, it is possible to easily form the low concentration impurity region without requiring a specific step such as formation of a side wall.

After the ion implantation steps, activation of added impurity ions and repairing of crystallinity of the active layer disordered by the ion implantation are carried out. Heating means such as furnace annealing, laser annealing and lamp annealing may be used as activation means.

Next, a silicon oxide film is formed as the first interlayer insulating film 618 (or 643), and after contact holes are formed, the source lines 619, 620, 644 and 646, drain line 621, and connection wiring line 645 are formed. Thereafter, as the second interlayer insulating film 622 (or 647), a silicon nitride film with a thickness of 500 Å and a silicon oxide film with a thickness of 250 Å are formed in this order to form a laminated film.

Figure 9A:
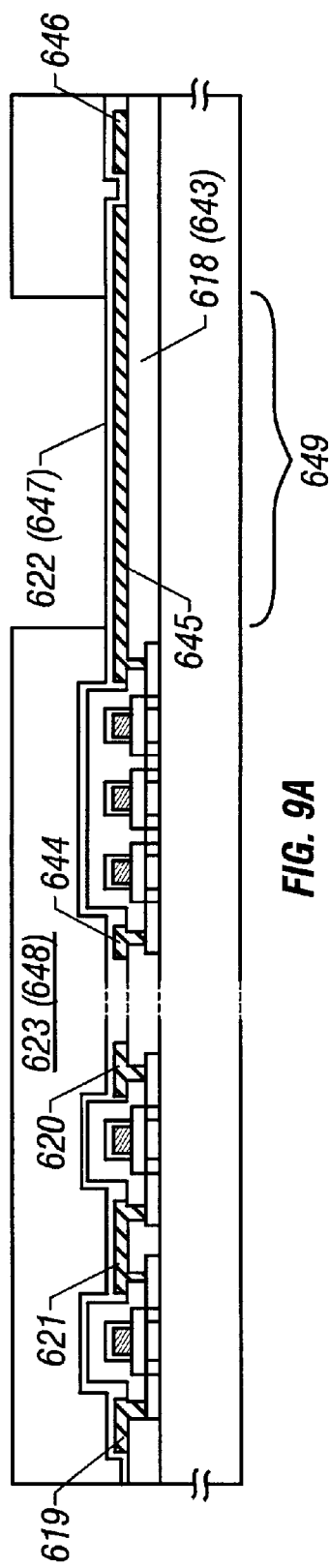
FIGS. 9A and 9B are views showing manufacturing steps of the CMOS structure and the pixel region.

Further, as the third interlayer insulating film 623 (or 648), a polyimide film with a thickness of 0.5 to 3 μm (preferably 1 to 1.5 μm) is formed. An opening for forming an auxiliary capacitor is provided at the region 649 in the third interlayer insulating film 623. The formation of the opening may be carried out by a dry etching method. At this time. the silicon oxide film of the second interlayer insulating film 622 functions as an etching stopper to the polyimide film (FIG. 9A).

Next, a titanium film with a thickness of 2000 Å is formed as the black matrix 650, and at the same time, the auxiliary capacitance 651 is formed. Further, a polyimide film with a thickness of 0.5 to 3 μm (preferably 1 to 1.5 μm) is grown as the fourth interlayer insulating film 624 (or 652). After a contact hole is formed, the pixel electrode 653 made of a transparent conductive film is formed.

It is an important factor of the present invention to form the third interlayer insulating film 623 and the fourth interlayer insulating film 624 with the organic resin material (typically polyimide, acryl, polyamide, polyimide amide, etc.) as described above. The most remarkable feature of the organic resin material is that the relative dielectric constant is low (about 2.0 to 3.4). By this, the parasitic capacitance between wiring lines can be greatly decreased. That is, lowering of operating speed can be effectively suppressed when a circuit requiring high frequency driving, such as a logic circuit, is formed.

Figure 9B:
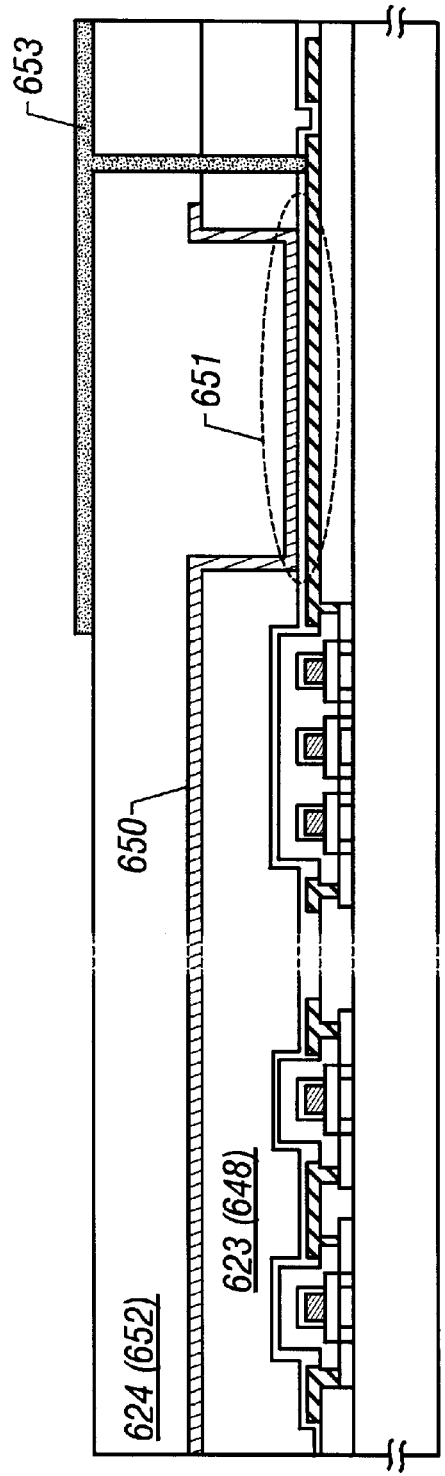

Finally, the entire of the obtained TFT is hydrogenated by heat treatment in a hydrogen atmosphere to decrease dangling bonds in the active layer. In this way, the active matrix display in which the CMOS structure and the pixel TFT are integrally formed on the same substrate as shown in FIG. 9B, is completed. Incidentally, it is effective to cover the completed TFT with a passivation film of a silicon nitride film or the like in preventing deterioration with are.

[Embodiment 3]

In the embodiment 1, it has been described that the silicon thin film invented by the present inventors is necessary for constituting the active matrix display shown in FIG. 1. In the embodiment 2, there have been described the CMOS structure and the pixel TFT structure actually constituted by the TFTs using the silicon thin films, and the manufacturing steps thereof.

In this embodiment 3, assuming the case where the TFTs of the present invention are arranged in the active matrix display as shown in FIG. 1, the structure to obtain the optimum circuit characteristics for each of uses (for each of circuit structures) will be described.

Based on the fact that necessary driving power is different for each logic circuit, the basic point of this embodiment is to optimize the structure of a TFT forming a circuit so that the optimum characteristics or minimum characteristics can be obtained for each logic circuit. Assuming the case where the active matrix type liquid crystal display device for VGA (640×480 pixels) shown in the block diagram of FIG. 10A is constituted, means for realizing the optimization will be described.

Figure 10A:
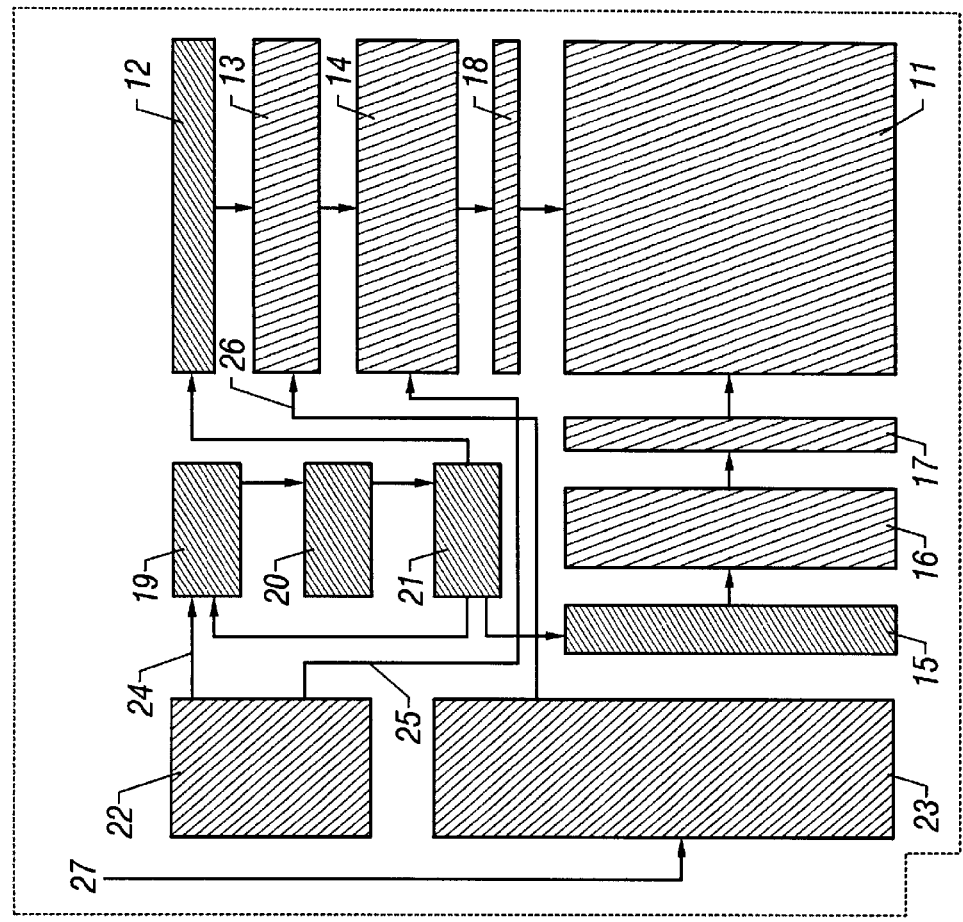
FIGS. 10A to 10D are views for explaining the arrangement and structures of circuits.

In FIG. 10A, 11 denotes a pixel matrix circuit, 12 denotes a horizontal scanning oscillator, 13 denotes a horizontal scanning shift resister, 14 denotes a D/A converter, 15 denotes a vertical scanning oscillator, 16 denotes a vertical scanning shift register, and 17 and 18 denote buffers. Here, since the circuit structure is designed while keeping digital driving in mind, a latch circuit is included in the horizontal scanning shift resister 13. Reference numeral 19 denotes a phase comparator (including a low pass filter), 20 denotes a voltage controlled oscillator, 21 denotes a frequency divider, 722 denotes an arithmetic circuit, and 23 denote a memory circuit. Further, reference numeral 24 denotes a horizontal/vertical synchronous signal, 25 denotes an analog signal for tone display, 26 denotes a bit signal (digital signal) for selecting the analog signal, and 27 denotes an image signal transmitted from the outside.

In the active matrix display shown in FIG. 1, the logic circuit 105 includes all the horizontal scanning oscillator 12, A/D converter 14, vertical scanning oscillator 15, phase comparator 19, voltage controlled oscillator 20, frequency divider 21, arithmetic circuit 22, memory circuit 23 and the like, and they may be formed with suitable arrangement according to necessity.

In the block diagram shown in FIG. 10A, electric circuits (pixel matrix circuit, driver circuit and logic circuit) having respective functions require different performance (characteristics) according to the functions. Especially, in the logic circuit, since processing conventionally performed by an IC is performed by TFTs, a driving frequency (clock frequency and the like for driving the circuit) up to an extremely high frequency is required.

With respect to the driving frequency, it may be basically said that the faster, the better. However, since the maximum driving frequency is greatly influenced by the performance of the respective TFTs constituting the circuit, it is a precondition to use the TFT enabling high speed driving as described in the embodiment 1.

For example, in the case of VGA, the horizontal/vertical synchronous signal 24 and the clock signal are about 25 MHz. That is, in order to reproduce an image signal faithfully on a display, as a clock frequency for driving the horizontal scanning shift register 13 and the vertical scanning shift register 16, a frequency of at least 25 MHz, preferably about 50 MHz is required. Thus, all the D/A converter 14, buffers 17 and 18, and pixel matrix circuit 11 receiving the source signal and gate signal from the respective shift resisters 13 and 16 require a driving frequency of about 50 MHz (0.05 GHz).

Since the horizontal scanning oscillator 12 and the vertical scanning oscillator 15 for oscillating clock signals synchronous with the horizontal/vertical synchronous signal 24 to the respective shift resisters 13 and 16, require a driving frequency several times the shift resisters 13 and 16, there is a case where a high driving frequency of about 0.1 to 0.5 GHz is needed.

The phase comparator 19, the voltage controlled oscillator 20, and the frequency divider 21 perform a function to correct the phase difference between the clock signal and the horizontal/vertical synchronous signal to make synchronization. Thus, the phase comparator 19, the voltage controlled oscillator 20 and the frequency divider 21 also require a driving frequency of about 0.1 to 0.5 GHz.

As shown in the block diagram of FIG. 10A, when the arithmetic circuit 22 is structured so that the horizontal/vertical synchronous signal 24 and the analog signal 25 are oscillated, the arithmetic circuit 22 requires an extremely high driving frequency (0.2 to 2 GHz). At the same time, also the memory circuit 23 for temporarily storing an image signal requires such a high driving frequency as 0.2 to 2 GHz in order to exchange information at high speed with the arithmetic circuit 22.

As described above, in order to form the circuit structure as shown in the block diagram of FIG. 10A on the same substrate, it is necessary to realize a TFT capable of operating in an extremely wide range of driving frequencies. In the present invention, by using the fact that the frequency characteristics of the respective TFTs are theoretically increased in proportion to the reciprocal of the square of the channel length L, a desired driving frequency can be obtained by controlling the channel length.

Of course, the feature that the desired driving frequency can be obtained by merely changing, the channel length, is obtained since the silicon thin film used in the present invention can suppress the short channel effect by the unique crystal structure without using the channel doping method.

However, when the frequency characteristics are improved by decreasing the channel length (L), a drain withstand voltage of the TFT becomes a problem. This problem can be solved by weakening an electric field applied to the vicinity of a drain. In such a case, in order to assure the drain withstand voltage while allowing high frequency driving, it is preferable to lower an operating voltage (power source voltage: $V_{DD}$) to decrease a load applied to a drain contact. For the purpose, it becomes necessary to lower a threshold voltage.

Conventionally, the lowering of the threshold voltage due to the short channel effect is suppressed by channel doping. In the case of the TFT of the present invention, the lowering of the threshold voltage is offset by the narrow channel effect occurring in the silicon thin film. Thus, it is possible to easily control the threshold voltage by thinning the film thickness of the gate insulating film.

In this case, the control of the film thickness of the gate insulating film may be carried out by using a method of selective lamination using a mask, or a method of selectively oxidizing a silicon thin film by using a mask, such as a LOCOS method.

Thus, by chancing, the channel length (L) and the film thickness (T) of the gate insulating film in accordance with a required circuit, it becomes possible to carry out an operation at a desired driving frequency and an operating voltage. However, the structure of this embodiment is first made possible by the TFT of the present invention shown in the embodiment 1, and it is very difficult to practice this structure by a conventional TFT since the conventional TFT receives the influence of the short channel effect.

In order to suitably design a circuit, it is necessary to consider not only a driving frequency but also a required operating voltage.

However, since the consumption of electric power increases in proportion to the square of an operating voltage ($V_{DD}$), it is basically preferable that the operating voltage is low.

However, in FIG. 10A, the pixel TFT constituting the pixel matrix circuit 11 requires an operating voltage of about 14 to 16 V in the present circumstances, since the threshold voltage (±5 V in a TN material) of a liquid crystal material and the threshold voltage (±2 to 3 V including a margin) of the pixel TFT itself must be considered.

Thus, in FIG. 10A, the matrix circuit 11, shift resisters 13 and 16, D/A converter 14, buffers 17 and 18, and the like require the operating voltage of about 14 to 16 V. Although not shown in the block diagram of FIG. 10A, if a level shifter is provided in front of the buffer, the operating voltage thereof is also made about 14 to 16 V.

As described above, in the presently used liquid crystal display device, mainly by restriction of a liquid crystal material, the periphery of the pixel matrix circuit often requires an operating voltage of about 14 to 16 V. Thus, in this embodiment, in order to constitute a circuit having the performance of an operating voltage of 14 to 16 V and driving frequency of 50 MHz, the CMOS structure as shown in FIG. 10B is adopted.

Figure 10B:
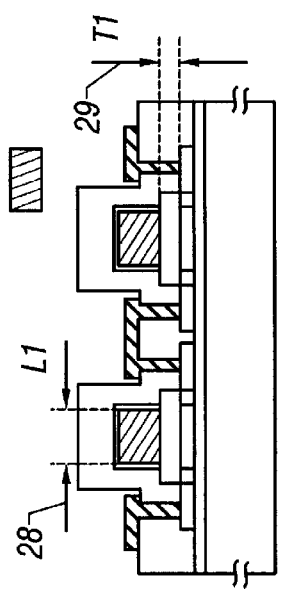

FIG. 10B shows the CMOS structure explained in FIG. 6A, and the detailed description of the structure will be omitted here. The important point in FIG. 10B is the channel length (L1) 28 of the TFT and the film thickness (T1) 29 of the gate insulating film. Here, the channel length means the length of the channel formation region, that is, the line width of the gate electrode capable of substantially functioning as an electrode. Thus, the channel length does not include the length of the offset region, the LDD region, and the like.

In the case of the circuit using the structure shown in FIG. 10B, since the driving frequency is about 50 MHz, it is sufficient that the channel length (L1) 28 is 1.5 to 2.5 µm (typically 2 μm) in the case of the TFT of the present invention. Since the operating voltage is high to be 14 to 16 V, the film thickness (T1) of the gate insulating film is made a little thick to be 1000 to 2000 Å (typically 1200 Å) to improve the drain withstand voltage.

The present inventors refer the TFT as shown in FIG. 10B. which is needed to be driven in the region of a high operating voltage exceeding 10 V, as a high withstand voltage driving TFT (or a low frequency driving TFT). It is desired that the film thickness of the rate insulating film of the high withstand voltage driving TFT is made 1000 Å or more.

It is experimentally confirmed that the TFT of the present invention can operate at a driving voltage of 16 V without any trouble. However, it is effective in improving the reliability and lowering the consumption of electric power to make devisal of giving an allowance to the drain withstand voltage of the TFT, for example, by using a triple gate pixel TFT or driving the shift registers 13 and 16, and the D/A converter at a voltage of 9 to 10 V. If the film thickness of the rate insulating film of the TFT driven at a voltage of 9 to 10 V is made about 700 to 1000 Å (typically 800 Å), the driving frequency can be further raised.

Figure 10C:
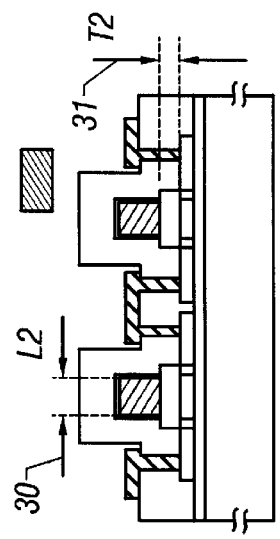

Next, with respect to the horizontal scanning oscillator 12. vertical scanning oscillator 15, phase comparator 19, voltage controlled oscillator 20 and frequency divider 21, since these circuits require a driving frequency of about 0.1 to 0.5 GHz, a CMOS structure as shown in FIG. 10C is adopted.

The feature of the CMOS structure shown in FIG. 10C is that the channel length (L2) 30 becomes shorter than and the film thickness of the gate insulating film (T2) 31 becomes thinner than the CMOS structure shown in FIG. 10B. That is, the size of the device is totally smaller than the structure shown in FIG. 10B.

In the case of the TFT of the present invention, in order to realize the driving frequency of 0.1 to 0.5 GHz, it is satisfactory to form the TFT so that the channel length (L2) 30 is within the submicron range of 0.5 to 1.0 μm (typically 0.7 μm). As described above, since the drain withstand voltage becomes a problem as the driving frequency is raised. the film thickness (T2) 31 of the gate insulating film is made 400 to 600 Å (typically 500 Å) to lower the operating voltage to about 5 V.

Figure 10D:
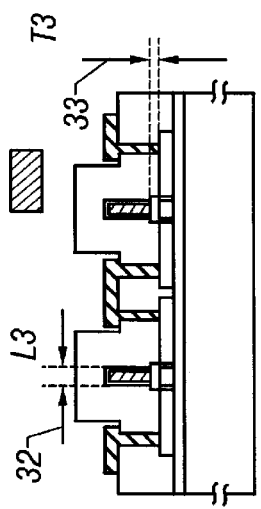

Since the arithmetic circuit 22 and the memory circuit 23 require an extremely high driving frequency of about 0.2 to 2 GHz, a CMOS structure as shown in FIG. 10D is adopted. In the CMOS structure shown in FIG. 10D, the channel length (L3) 32 is made minute to a deep submicron range and the film thickness (T3) 33 of the gate insulating film is also made very thin.

In the case of the TFT of the present invention, in order to realize a driving frequency of about 0.2 to 2 GHz, the channel length (L3) 32 is made 0.1 to 0.5 μm (typically 0.35 μm) and the film thickness (T3) 33 of the gate insulating film is made 200 to 400 Å (typically 300 Å) so that the operating voltage can be lowered to 3.3 V.

The present inventors refer the TFT as shown in FIGS. 10C and 10D, which is driven in the range of such a high driving frequency as 0.1 GHz or more, as a high frequency driving TFT. It is desirable that the film thickness ot the gate insulating film of the high frequency driving TFT is made 500 Å or less.

As described above, the channel length (L) of the TFT and the film thickness (T) of the ate insulating film thereof are made different according to necessity, so that it becomes possible to realize the minimum frequency characteristics required by a circuit, whereby the systemized active matrix display in which various logic circuits are formed on the same substrate can be realized.

Since the operating voltage can be lowered while increasing the driving frequency, it is also possible to constitute an active matrix display having extremely low consumption of electric power. That an electric circuit such as a logic circuit is driven at a voltage of 5 V (or 3 V) has a merit that the compatibility of input/output of signals is superior in the case where the electric circuit is needed to be combined with an IC chip which is normally driven at a voltage of 5 V (or 3.3 V).

In this embodiment, there is shown an example in which the channel length (L) is suitably selected within the range of 0.1 to 2 μm. and the film thickness (T) of the gate insulating film is suitably selected within the range of 200 to 1500 Å. However, the specific values and the like shown in the embodiment are merely one example of the present invention, and do not limit the present invention.

The important point of this embodiment is that both the high frequency driving TFT and the high withstand voltage driving TFT can exist on the same substrate at the same time, and as a result, the active matrix display in which the pixel matrix circuit, driver circuit and logic circuit are mounted on the same substrate can be realized.

It is easily expected that in future, the size of a device is further miniaturized and the demand for a circuit requiring a high speed operation is increased. At that time, it appears that the lower limit of the selected range of the channel length (L) in the present invention becomes 0.01 μm or less, and the lower limit of the selected range of the film thickness (T) of the gate insulating film becomes 50 Å or less. The present inventors assume a possibility that in future, a logic circuit driven at a ultra high frequency of 2 GHz or more is formed by the TFT of the present invention, and consider that the present invention becomes a further effective technique in such a case.

[Embodiment 4]

In this embodiment, circuit structures of various logic circuits using the TFT of the present invention will be described in brief. Prior to explaining the active matrix display shown in FIG. 1 as an example, the structure of a basic inverter and the like will be described with reference to FIGS. 1A to 11E.

Figure 11A:
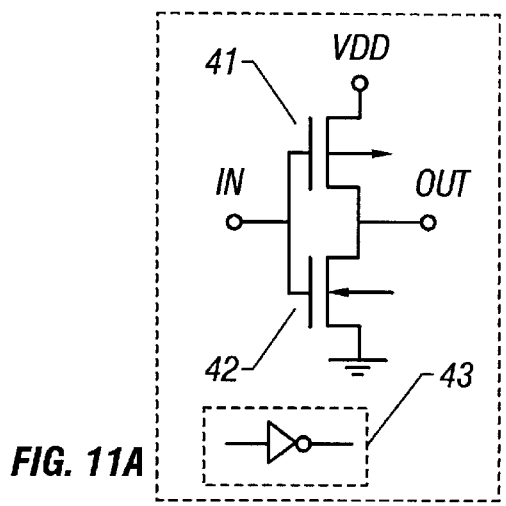
FIGS. 11A to 11E are views showing basic circuits.

FIG. 11A shows an inverter circuit, which is constituted by a CMOS structure in which a P-channel TFT 41 and an N-channel TFT 42 are complementarily combined. Reference numeral 43 expresses a circuit symbol of the inverter circuit.

Figure 11B:
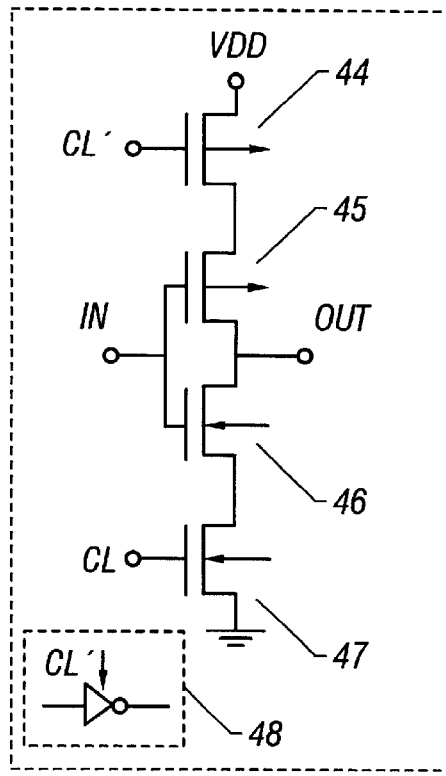

FIG. 11B shows a clocked inverter, which is constituted by P-channel TFTs 44 and 45, and N-channel TFTs 46 and 47. In this case, a clock signal CL is inputted to gate electrodes of the N-channel TFTs 46 and 47, and an inverted clock signal CL' is inputted to gate electrodes of the P-channel TFTs 44 and 45. Reference numeral 48 expresses a circuit symbol of the clocked inverter. When the clock signals inputted to the N-channel TFTs and the P-channel TFTs are exchanged, such a clocked inverter of reverse polarity as is turned on when the clocked inverter 44 shown in FIG. 1B is turned off, is obtained.

Figure 11C:
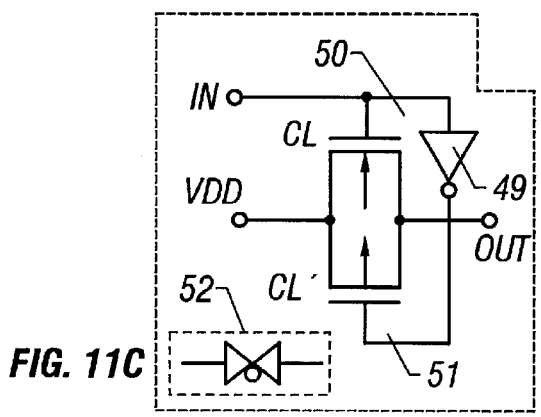

FIG. 11C shows an analog switch, which is constituted by an inverter 49, an N-channel TFT 50, and a P-channel TFT 51. A clock signal CL is inputted to the N-channel TFT 50, and an inverted clock signal CL' is inputted to the P-channel TFT 52. Reference numeral 52 expresses a circuit symbol of the analog switch. The analog switch has a function similar to the clocked inverter shown in FIG. 11B. Of course, if the polarity of an inputted clock signal is exchanged, the polarity (on/off operation) of the analog switch can be reversed.

Figure 11D:
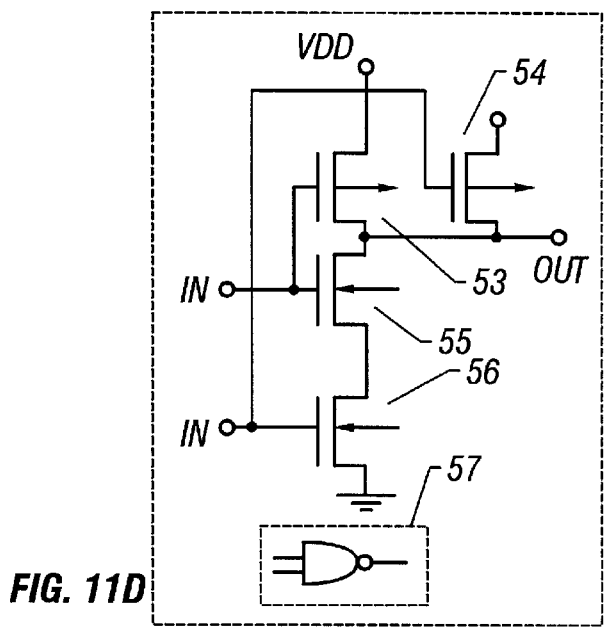
Figure 11E:
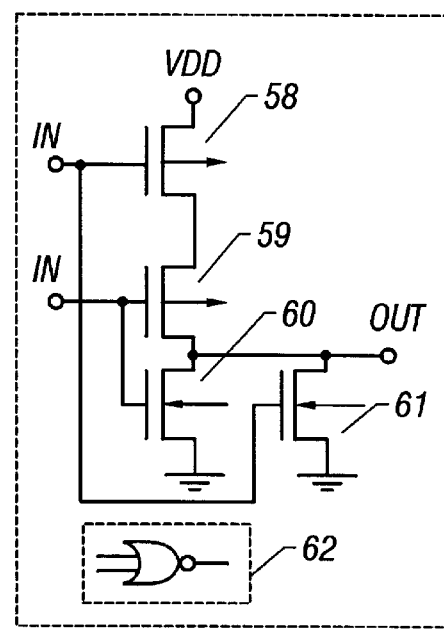

FIG. 11D shows a NAND circuit, which is constituted by P-channel TFTs 53 and 54, and N-channel TFTs 55 and 56. Reference numeral 57 expresses a circuit symbol of the NAND circuit. FIG. 11E shows a NOR circuit, which is constituted by P-channel TFTs 58 and 59. and N-channel TFTs 60 and 61. Reference numeral 62 expresses a circuit symbol of the NOR circuit. The NAND circuit shown in FIG. 11D outputs the inverted signal of logical product of input signals, and the NOR circuit shown in FIG. 11E outputs the inverted signal of logical sum of input signals.

Next, in the active matrix display shown in FIG. 1, an example of a basic structure of a horizontal scanning, shift resister and a latch circuit included in the source line driver circuit 103 will be described in brief with reference to FIGS. 12A to 12C. Of course, the structure of the shift register and the latch circuit is not limited to this. For example, a bidirectional shift register which operates even if the moving direction of a signal is reversed, may be used.

Figure 12A:
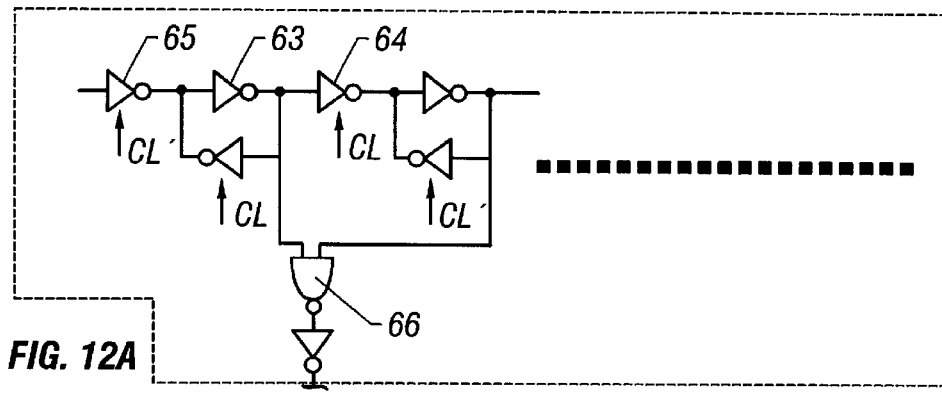
FIGS. 12A to 12C are views for explaining a horizontal scanning driver circuit.

First, FIG. 12A shows a shift register circuit. The shift register is basically constituted by connecting plural stages of combinations or an inverter 63 and clocked inverters 64 and 65 in series. At this time, the structure of the inverter 63 is as shown in FIG. 11A, and the structure of the clocked inverter 64 is as shown in FIG. 11B. An inverted clock signal is inputted to the clocked inverter 65 so that it is turned off when the clocked inverter 64 is turned on. The analog switch as shown in FIG. 11C may be used instead of the clocked inverter 64.

Since the structure shown in this embodiment is such that logical product is taken for the output signals of the N-th stage and (N+1)-th stage by the NAND circuit 66 as shown in FIG. 11D and are outputted, the following merits can be obtained: (1) output signals do not overlap (pulse edge becomes steep), (2) the structure can operate at substantially twice the driving frequency, and the like.

Figure 12B:
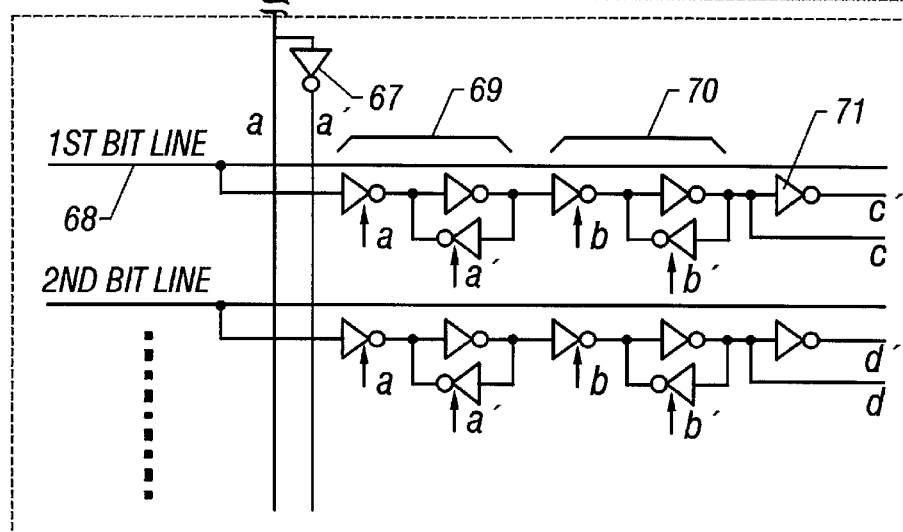

Next, a signal "a" outputted from the shift resister circuit is divided into the signal "a" and inverted signal "a" by using an inverter 67, and they are transmitted to a latch circuit shown in FIG. 12B. Then the signal "a" and the inverted signal "a" are inputted as clock signals to the first stage latch 69 connected to each of a plurality of bit signal lines 68. Incidentally, if the number of the bit signal lines is N, it is possible to display an image with $N^2$ tones.

Next, when clock signals "b" and "b" are inputted to the second stage latch 70, signals kept by a plurality of (N in number) latches 69 are transmitted to N latches 70 at the same time. Then the signals transmitted to the latches 70 are divided into signals $c_1$ and $d_1$, and inverted signals $c_1'$ and $d_1'$ by using inverters 71. Here, although a line-sequential system is used as an example, the basic operation is the same even in a line-sequential system.

Figure 12C:
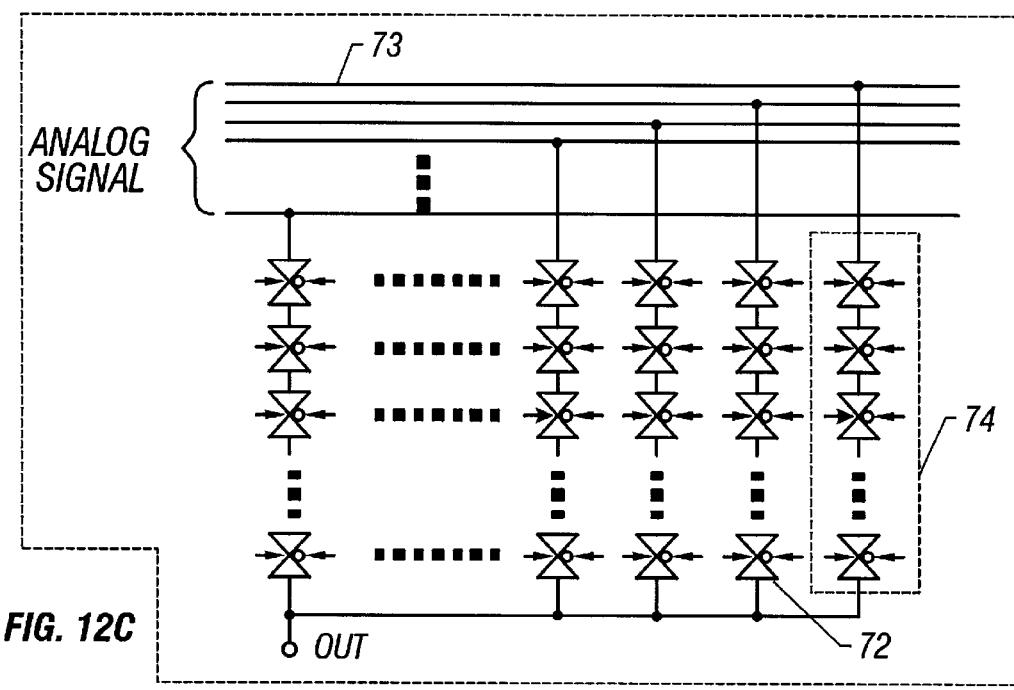

Bit signals ($c_1, d_1, \ldots$ and $c_1', d_1', \ldots$) outputted from the latch circuit are transmitted to a D/A converter shown in FIG. 12C. In the D/A converter shown in FIG. 12C, analog switches 72 (see FIG. 11C), the number of which is the same as the number of the bit signal lines 68, that is, N analog switches 72 are connected in series to each other. Rows 74, each of which is made of the N analog switches and the number of which is the same as the number of the analog signal lines 73, that is, $N^2$ rows 74 are arranged in parallel with each other, and are respectively connected to a predetermined analog signal line.

The D/A converter of this embodiment has such a structure that the plurality of analog switches 72 are combined so that tone signals are selectively taken out of the $N^2$ analog signal lines 73. The operation principle will be described below in brief.

First, we consider the bit signals ($c_1$ and $c_1'$) from the first bit line as an example. The bit signals sent from the latch circuit of FIG. 12B are inputted, as clock signals, to all $N^2$ analog switches arranged in the uppermost stage (first stage) in FIG. 12C. It is designed such that some of $N^2$ analog switches are turned on with some rule, and the remainder are turned off.

In the similar manner to the above, the second stave analog switches are also turned on or off with the clock signals of the bit signals (d and d') from the second bit line. At this time, the on/off states of the second stage analog switches are designed with a rule different from the first stare.

The similar design to the above is made for the third stage and the following, and finally it is designed that all N analog switches of only one line of the N' lines 74 arranged side by side are always turned on. In this way, it is designed such that only one analog signal line is always selected among the $N^2$ analog signal lines.

Figure 13A:
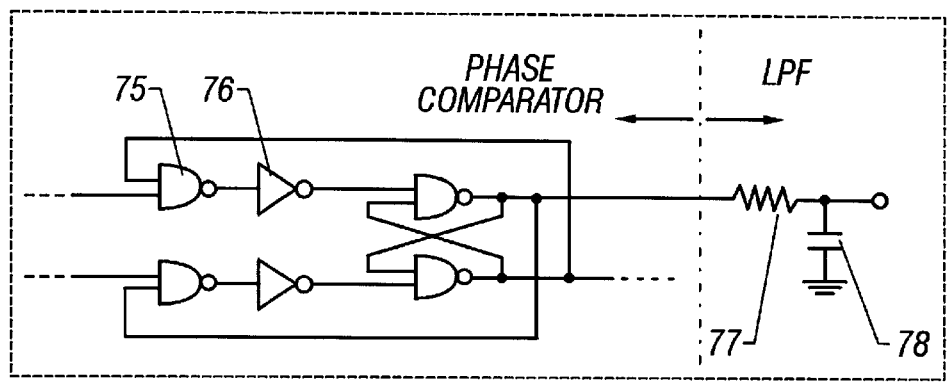
FIGS. 13A to 13C are views for explaining circuits for constituting a logic circuit.
Figure 13B:
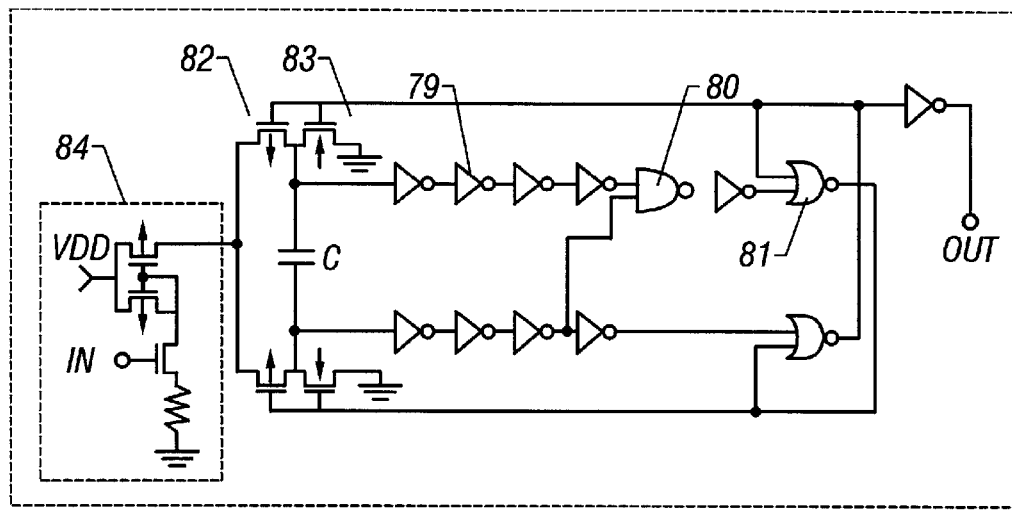
Figure 13C:
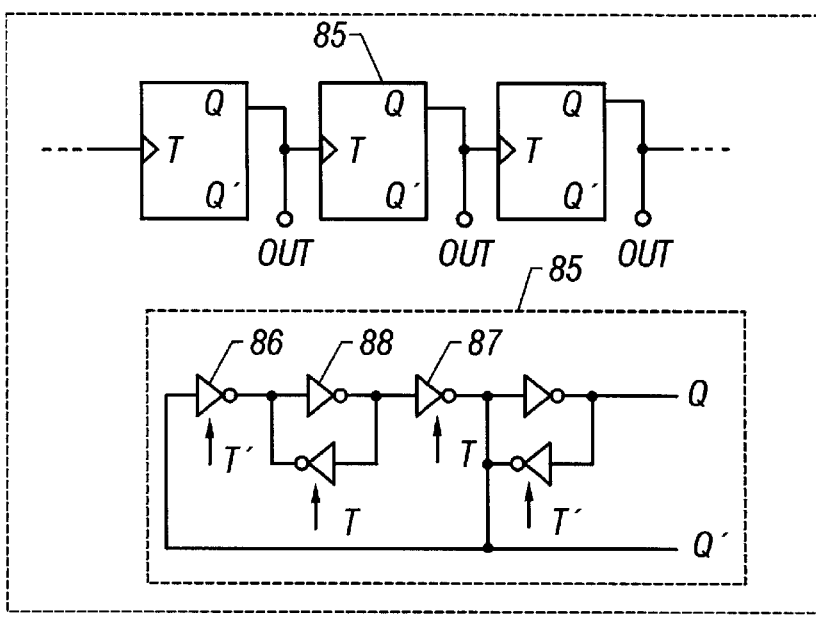

FIGS. 13A to 13C show an example of the circuit structure or the phase comparator 114, LPF (Low Pass Filter) 115, voltage controlled oscillator 116 and frequency divider 117 arranged in the active matrix display of FIG. 1.

FIG. 13A shows the phase comparator 114, which is constituted by combining four NAND circuits 75 (see FIG. 11D) and two inverters 76 (see FIG. 11A). The LPF 115 is constituted by a resistor 77 connected to the output terminal of the phase comparator 114, and a capacitor 78.

FIG. 13B shows the voltage controlled oscillator 116, which is constituted by combining an inverter 79, a NAND circuit 80, a NOR circuit 81 (see FIG. 11E), a P-channel TFT 82 and an N-channel TFT 83. Reference numeral 84 denotes a circuit for constituting a constant-current source.

FIG. 13C shows the frequency divider 117, which is constituted by connecting T-F/F (toggle flip-flop) circuits 85 in series. The number of the circuits is suitably selected according to the decree of frequency division. The T-F/F circuit 85 is constituted by forming a loop of inverters 86 and 87 and an inverter 88. Since the clocked inverters 86 and 87 and the inverter 88 have been described in detail, the explanation thereof will be omitted.

In the above embodiment, the circuit structures incorporated in the active matrix display of FIG. 1 have been described. However, various logic circuits can be constituted by combining the basic circuits shown in FIGS. 11A to 11B, and a further complicated circuit structure can be formed.

[Embodiment 5]

In this embodiment, there will be described an example in which a CMOS structure is formed in manufacturing steps different from those explained with reference to FIGS. 3 and 9. This embodiment will be described with reference to FIG. 14 while paying attention to only the CMOS structure.

First, active layers 1402 and 1403 are formed on a quartz substrate 1401. After a silicon oxide film (later gate insulating film) 1404 is formed, a gettering process of a catalytic element (heat treatment in an atmosphere containing a halogen element) is carried out. so that the active layers 1402 and 1403 are transformed into silicon thin films used in the present invention. So far, the silicon thin films can be formed in accordance with the steps shown in the embodiment 1.

Next, a pattern (not shown) made of a material mainly containing aluminum is formed on the active layers 1402 and 1403. Thereafter, anodic oxidation is carried out in an ethylene glycol solution containing tartaric acid of 3% to form dense anodic oxidation films 1405 and 1406. Here, gate electrodes 1407 and 1408 are defined.

Figure 14A:
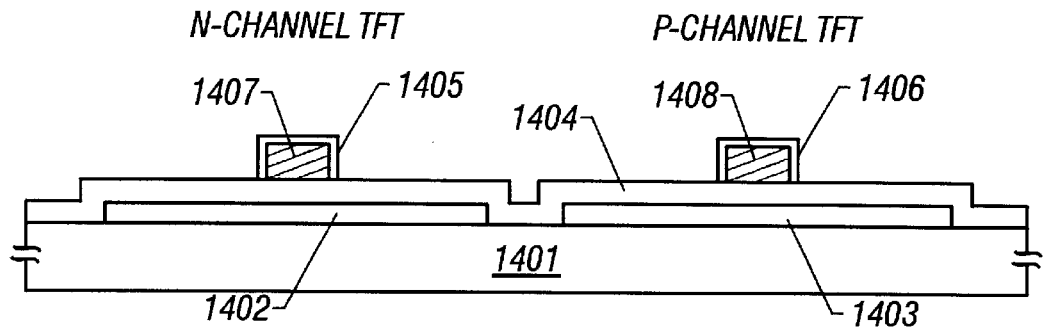
FIGS. 14A to 14D are views showing manufacturing steps of a CMOS structure.

After the state shown in FIG. 14A is obtained in this way, an impurity ion to give one conductivity is implanted to the active layers 1402 and 1403. This ion implantation step is carried out such that a P ion is added to an N-channel TFT and a B ion is added to a P-channel TFT by using a mask. By this ion implantation step. N-type impurity regions 1409 and 1410, and P-type impurity regions 1411 and 1412 are formed.

After the impurity ion implantation is finished, a silicon nitride film 1413 with a thickness of 0.5 to 1 $\mu$m is formed. The film forming method may be a low pressure thermal CVD method, a plasma CVD method, or a sputtering method. Also, a silicon oxide film may be used instead of the silicon nitride film.

Figure 14B:
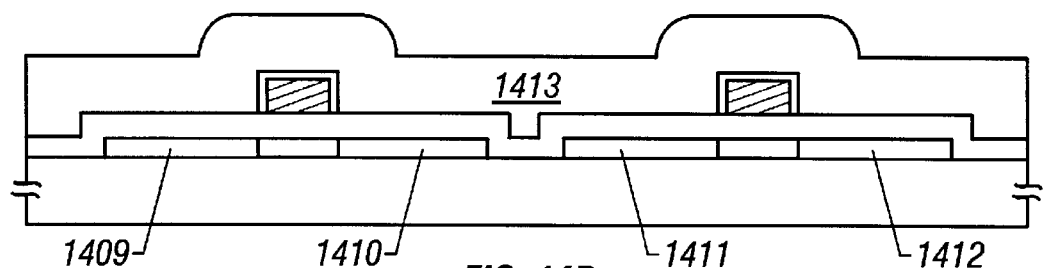

In this way, the state shown in FIG. 14B is obtained. After the stage shown in FIG. 14B is obtained, the silicon nitride film 1413 is etched by an etch back method, so that the silicon nitride film is made to remain at only side walls of the gate electrodes 1407 and 1408. By this step, side walls 1411 and 1415 are formed on the sides of the gate electrodes 1407 and 1408.

Next, the silicon oxide film 1404 is etched by a dry etching method by using the side walls 1414 and 1415 and the gate electrodes 1407 and 1408 as masks. By this step, gate insulating films 1416 and 1417 in the state as shown in FIG. 14C are formed.

Figure 14C:
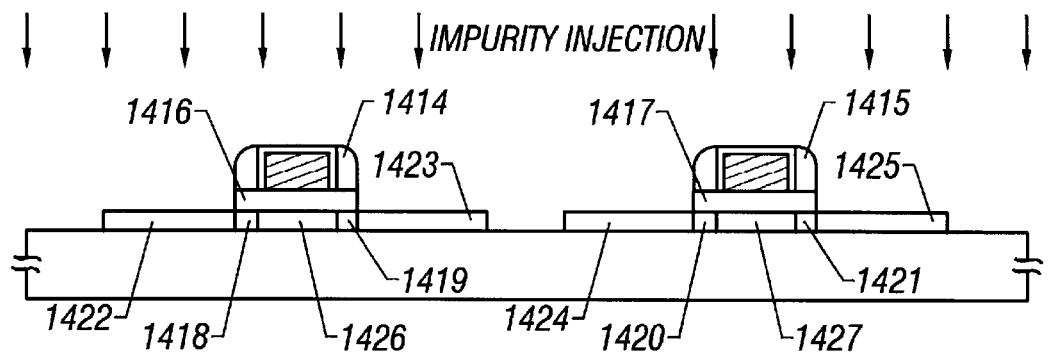

An impurity ion is again implanted in the state as shown in FIG. 14C. Also in this ion implantation step, different ions are added to the N-channel TFT and the P-channel TFT. At this time, a does of ions is made a little higher than that in the previous ion implantation.

At this ion implantation, since the ions are not implanted to regions 1418 to 1421 just under the side walls 1414 and 1415, the concentration of impurity ions does not vary. However, the impurity ions of higher concentration are implanted to exposed regions 1422 to 1425.

Through the second ion implantation described above, there are formed a source region 1422, a drain region 1423, low concentration impurity regions 1418 and 1419, and a channel formation region 1426 of the N-channel TFT, and a source region 1425, a drain region 1424, low concentration regions 1420 and 1421, and a channel formation region 1427 of the P-channel (FIG. 14C).

After the state shown in FIG. 14C is obtained through the above steps, a not-shown tungsten film with a thickness of 300 Å is formed, and the tungsten film and the silicon film (active layer) are made to react with each other. After the tungsten film is removed, a heat treatment such as lamp annealing is carried out so that tungsten silicide films 1428 to 1431 are formed on the surfaces of the source regions 1422 and 1425, and the drain regions 1423 and 1424. In this step, a tantalum film, a titanium film, a molybdenum film or the like may be used instead of the tungsten film.

Figure 14D:
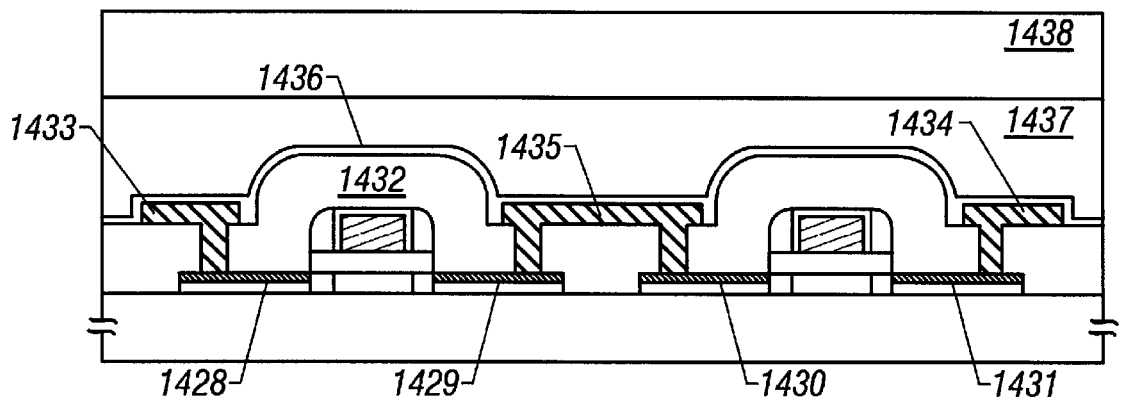

Next, a silicon oxide film with a thickness of 5000 Å is formed as an interlayer insulating film 1432, and then, source lines 1433 and 1434 and a drain line 1435 are formed. Further, in the process ot forming a pixel matrix circuit, a second interlayer insulating film 1436, a third interlayer insulating film 1437 and a fourth interlayer insulating film 1438 are formed. In this way, the CMOS structure as shown in FIG. 14D are obtained.

When the TFT is made into the structure (silicide structure) as shown in this embodiment, since the source/drain electrodes are connected to the source/drain regions through the titanium silicide films 1428 to 1431, good ohmic contact can be realized. Thus, it is possible to constitute a circuit with a small load and high driving frequency.

[Embodiment 6]

In this embodiment, an example in which a CMOS structure is formed by manufacturing steps different from those described with reference to FIGS. 8, 9 and 14, will be described with reference to FIGS. 15A to 15D.

First, in accordance with manufacturing steps described in the embodiment 1, active layers 1502 and 1503, and a silicon oxide film 1504, which becomes a gate insulating film later, are formed on a quartz substrate 1501. Gate electrodes 1505 and 1506 made of silicon thin films given one conductivity are formed thereon (FIG. 15A).

Figure 15A:
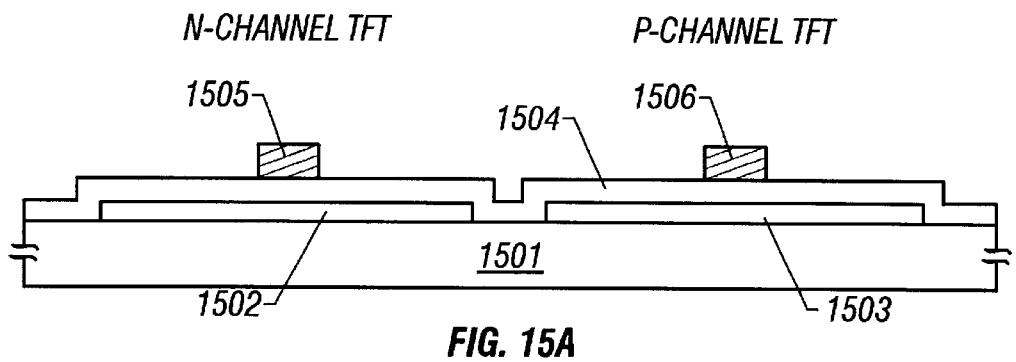
FIGS. 15A to 15D are views showing manufacturing steps of a CMOS structure.
Figure 15B:
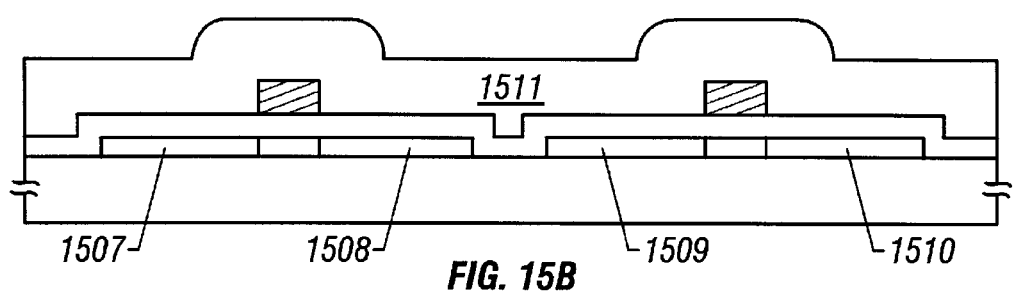

After the state shown in FIG. 15A is obtained, implantation of an impurity ion to give one conductivity is carried out to the active layers 1502 and 1503 in this state. The ion implantation step is carried out by selectively adding a P ion and a B ion. By this ion implantation step, N-type impurity regions 1507 and 1508 and P-type impurity regions 1509 and 1510 are formed.

After the impurity ion implantation is finished, by a step similar to the embodiment 5, a silicon nitride film 1511 is first formed. and then side walls 1512 and 1513 are formed by using an etch back method. Further, by a step similar to the embodiment 5, the silicon nitride film 1504 is etched, and gate insulating films 1514 and 1515 are formed in the state shown in FIG. 15C.

Figure 15C:
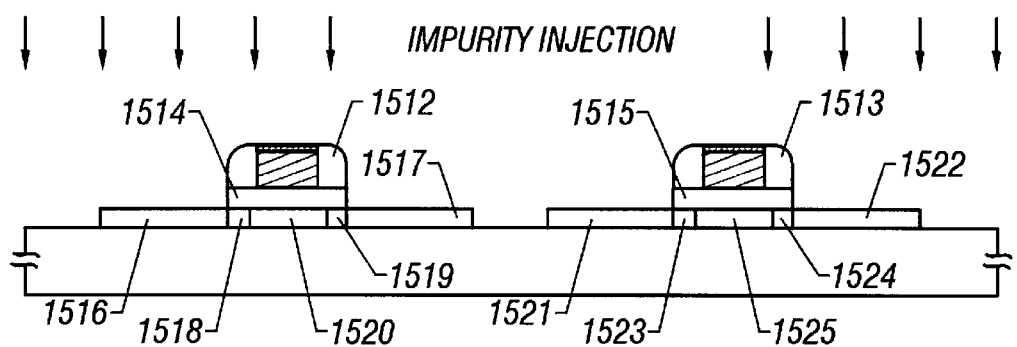
Figure 15D:
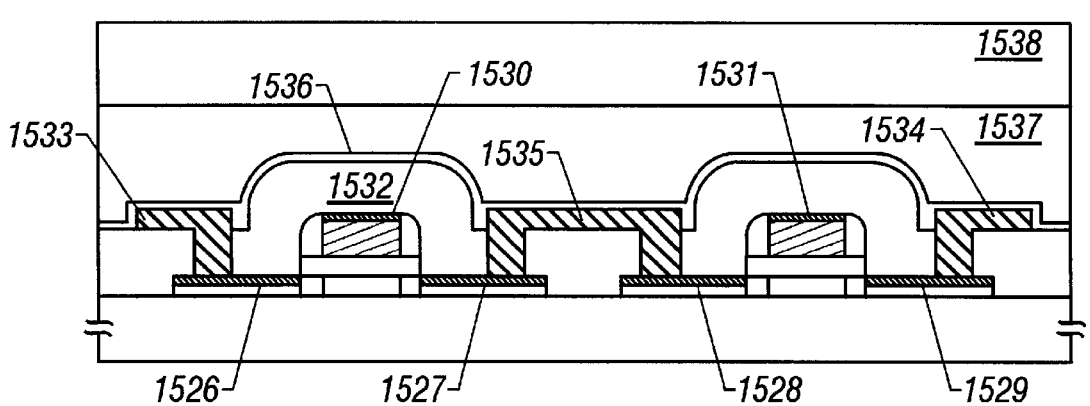

Impurity ion implantation is again carried out in the state shown in FIG. 15C. Also in this ion implantation step, similarly to the previous ion implantation step, different ions are added to the N-channel TFT and the P-channel TFT. At this time, a does of impurity ions is made a little higher than that in the previous ion implantation.

In this way, there are formed a source region 1516, a drain region 1517, low concentration impurity regions 1518 and 1519, and a channel formation region 1520 of the N-channel TFT, and a source region 1521, a drain region 1522, low concentration impurity regions 1523 and 1524, and a channel formation region 1525 of the P-channel TFT.

Next, a suicide formation step as described in the embodiment 5 is carried out by using a titanium film. As a result, titanium silicide films 1526 to 1531 are formed on the upper surfaces of the source regions 1516 and 1522, the drain regions 1517 and 1521, and the gate electrodes 1505 and 1506.

Next, an interlayer insulating film 1532 is formed, and source lines 1533 and 1534 and a drain line 1535 are formed. Then a second interlayer insulating film 1536, a third interlayer insulating film 1537 and a fourth interlayer insulating film 1538 are formed to obtain the CMOS structure shown in FIG. 15D. Also in this embodiment, good ohmic contact between the wiring lines and the TFT can be realized through the titanium suicide films. This embodiment is advantageous in that since the titanium suicide films 1530 and 1531 are also formed on the gate electrodes 1505 and 1506, load resistance applied to the gate line can be decreased.

[Embodiment 7]

It has been already described that the silicon thin film obtained by the process in the embodiment 1 described with reference to FIG. 2 is necessary to practice the present invention. In this embodiment, an example in which a silicon thin film crystallized by a means different from the embodiment 1 is made used in the present invention, will be described.

In FIG. 2, after the state (stare when the heat treatment for crystallization is finished) shown in FIG. 2C is obtained, the silicon oxide film 203 as a mask is removed. After the silicon oxide film 203 is removed, annealing by an excimer laser using KrF (wavelength 248 nm), XeCl (wavelength 308 nm) and the like as excitation gas, is carried out. The laser annealing step may be carried out before or after processing the silicon thin film into an island-like pattern.

By the above-mentioned laser annealing, an amorphous component slightly remaining in the crystalline silicon thin film is crystallized, and the crystallinity of the crystal silicon is remarkably improved. The active matrix display of the present invention can be formed even by using the thus obtained silicon thin film. This embodiment is advantageous in that an inexpensive glass substrate can be used as a substrate of an active matrix display. That is, the manufacturing cost can be decreased.

However, the most desirable mode in practicing the present invention is to use the TFT using the silicon thin film described in the embodiment 1. It is preferable to use this embodiment only in the case where there occurs a necessity to use a low heat resistance substrate such as a glass substrate.

The steps described in the embodiment 1 may be combined with the steps described in this embodiment. That is, such a structure may be adopted that after the laser annealing step, the gettering process of the catalytic element is carried out. In this case, the silicon thin film of higher crystallinity can be formed.

[Embodiment 8]

In this embodiment, there will be described an example in which a catalytic element for promoting crystallization is added by a means different from the technique disclosed in Japanese Patent Unexamined Publication No. Hei. 7-130652. This embodiment is effective whichever crystallizing means of the embodiment 1 and the embodiment 6 is adopted.

Figure 16A:
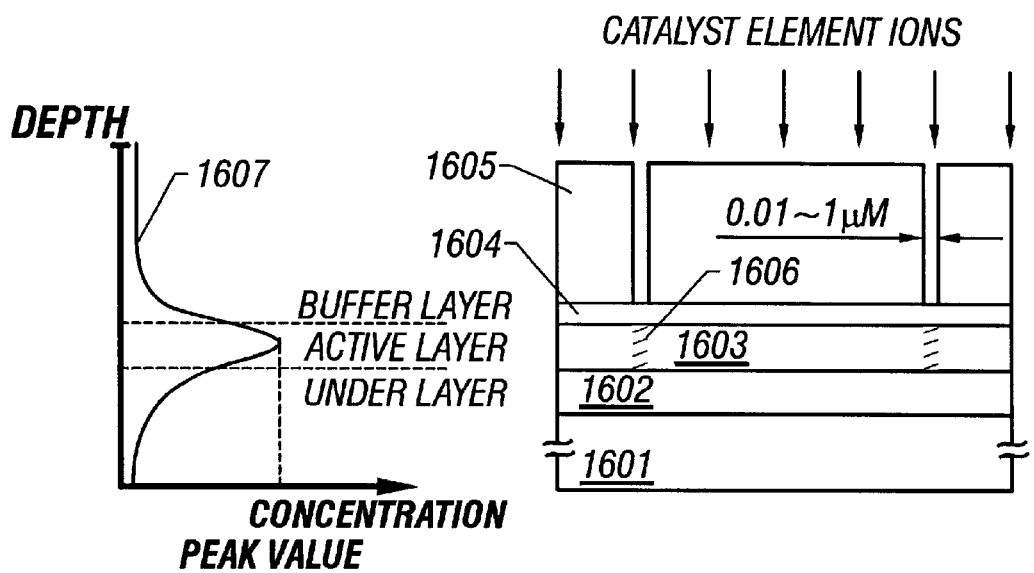
FIGS. 16A and 16B are views for explaining a method of adding a catalytic element.

In FIG. 16A, 1601 denotes a substrate (glass substrate or quartz substrate) having an insulating surface, 1602 denotes an under film made of a silicon oxide film, 1603 denotes an amorphous silicon thin film, and 1604 denotes a silicon oxide film (silicon nitride film or silicon nitride oxide film may be used) which becomes a buffer layer later.

Reference numeral 1605 denotes a resist mask, and only a region where a catalytic element is added is removed. It is preferable, as light exposure of the resist mask, to use a light exposure method using an excimer laser, a light exposure method using an electron beam or the like.

Since these light exposure methods enable the formation of an extremely minute pattern so that the added region of the catalytic element can be formed with a slit width of 0.01 to 1.0 μm (typically 0.1 to 0.35 μm). If the resist pattern is directly depicted by an electron beam or the like, the degree of freedom of the shape of the added region is greatly increased.

As shown in the left drawing of FIG. 16A, an ion is added in such a way that the peak value or an ion profile 1607 is located within the amorphous silicon thin film 1603. Thus, a reunion 1606 in which a catalytic element of a predetermined concentration (preferably $3 \times 10^{19}$ to $1.5 \times 10^{21}$ atoms/cm$^3$) is added, is formed in the silicon thin film 1603. Ions may be added by an ion injection method (ion implantation and the like) or an ion doping method (plasma doping and the like). However, the ion injection method in which only the catalytic element can be added, is preferable.

In this embodiment, the buffer layer 1604 covers the amorphous silicon thin film 1603, and only the catalytic element having passed through the buffer layer 1604 is used. Thus, the following effects can be obtained.

(1) Damage by the ion addition does not directly reach the amorphous silicon thin film 1603.

(2) Since only the vicinity of the peak value of the ion profile 1607 is used, the amount of the added catalytic element can be controlled with good reproducibility.

When the film thickness of the buffer layer 1604 is made 100 to 1500 Å (preferably 300 to 800 Å), the ion profile with good reproducibility can be obtained. If the film thickness is smaller than this range, almost all ions pass through the buffer layer, so that it becomes difficult to use only the vicinity of the peak value of the ion profile. If the film thickness is larger than this range, since it is necessary to make the acceleration voltage considerably high, a load applied to the device becomes high.

The optimum value of the film thickness is changed by what insulating film is used as the buffer layer. For example, if a silicon nitride film denser than the silicon oxide film is used, the film thickness of the buffer layer can be made thin.

Figure 16B:
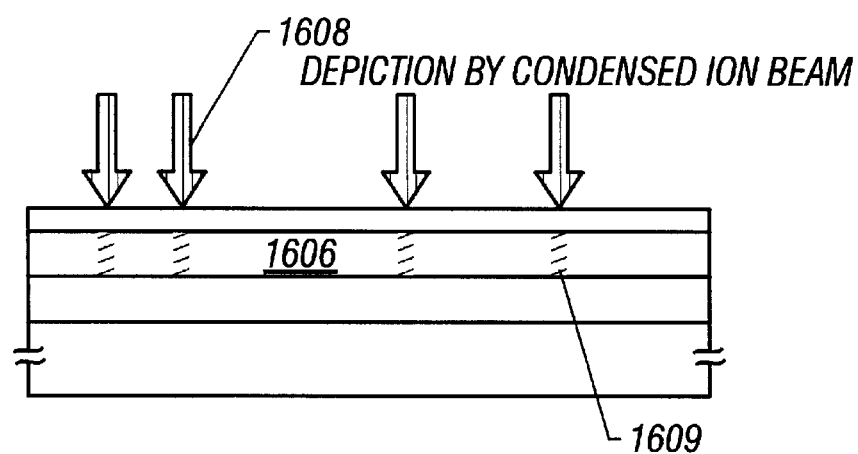

Means shown in FIG. 16B may be used as another example. The example shown in FIG. 16B is a method in which a catalytic element is directly added into the silicon thin film 1606 without using a resist mask, and can be practiced by using such a technique as is able to radiate an ion to only a minute spot, like an FIB (Focussed Ion Beam) method or the like.

In this example, as shown in FIG. 16B, a pattern is directly depicted by a condensed ion beam 1608, and it is possible to form an added region 1609 at a desired position with a desired shape.

As described above, according to this embodiment, the width of the added region of the catalytic element can be made minute to be 0.01 to 1.0 μm (typically 0.1 to 0.35 μm). Also, by using the electron beam method, the FIB method or the like, the added region may be directly depicted. This example has the effect that the shape and position of the region where the catalytic element is added, can be freely designed in conformity with the arrangement and structure of TFTs.

[Embodiment 9]

Figure 17:
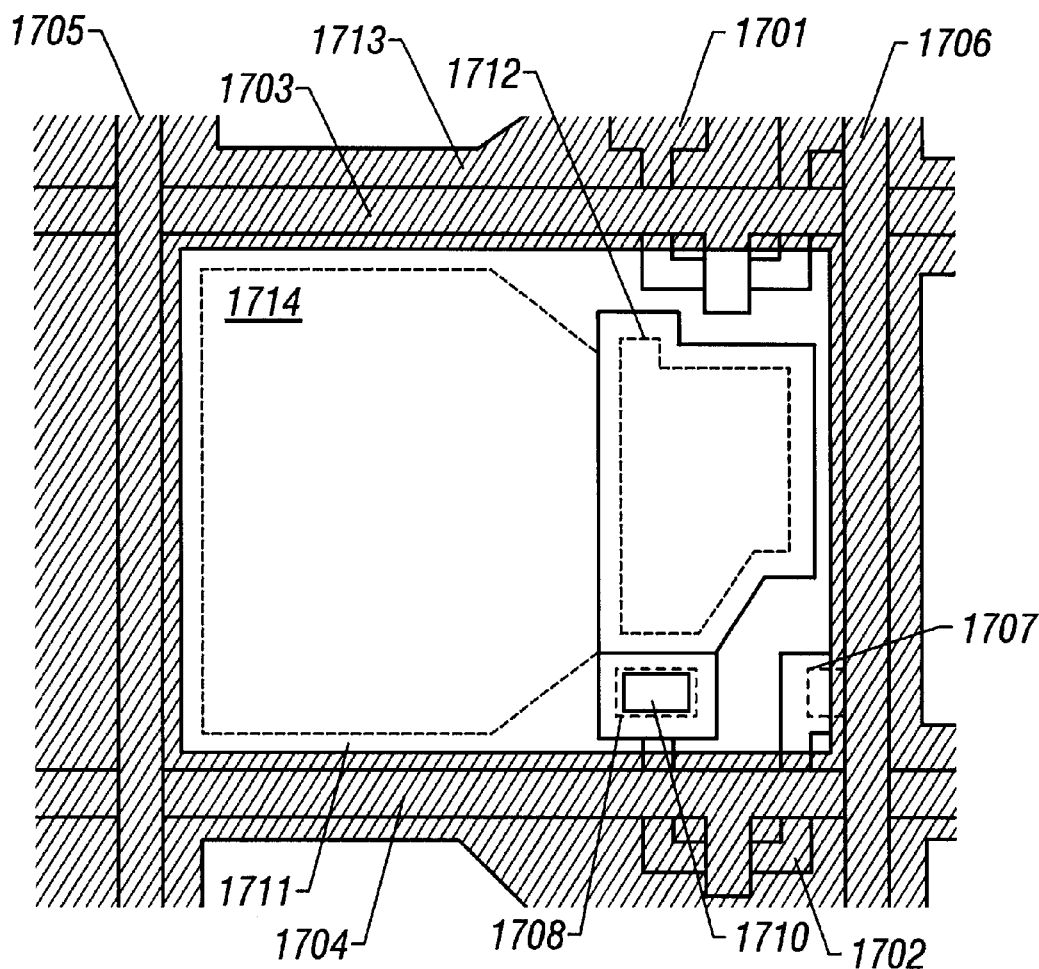
FIG. 17 is a view showing a pixel region seen from the above.

In this embodiment, an example in which the structure of a pixel region of a transmission type display device is made different from the structure shown in FIG. 7, will be described with reference to FIG. 17. In the structure shown in FIG. 17, 1701 and 1702 denote active layers, 1703 and 1704 denote source lines, 1705 and 1706 denote gate lines, 1707 denotes a contact portion of the source line 1706 and the active layer (source region) 1702, 1708 denotes a contact portion of the connection wiring line 1709 and the active layer (drain region) 1702, and 1710 denotes a contact portion of the connection wiring line 1709 and a pixel electrode 1711.

Reference numeral 1712 denotes an auxiliary capacitor, which is formed at a region where the black mask 1713 shown by oblique lines overlaps with the connection wiring line 1709. A region 1714 which is not shaded by the black mask 1713 becomes an image display region.

configuration as in the present embodiment is advantageous in securing sufficient auxiliary capacitance, since, in the case where the pixel region is an oblong rectangle, the auxiliary capacitor 1712 can be formed in the longitudinal direction (upward or downward direction with respect to the paper surface).

[Embodiment 10]

The present invention can be applied to any electrooptical devices, and particularly to an active matrix type liquid crystal display device, active matrix type EL display device, active matrix type EC display device, and the like.

These active matrix type display devices are roughly divided into a transmission type display device and a reflection type display device. For example, the transmission type liquid crystal display device is such a device that a back light is disposed at the back side of an active matrix substrate (substrate on which TFTs are disposed) and an image is recognized by seeing light being transmitted through a display unit. The reflection type liquid crystal display device is such a device that incident light from the surface side of an active matrix substrate is reflected by pixel electrodes disposed on the active matrix substrate and an image is recognized by seeing the reflected light.

Although there is no large difference in the structure of a TFT between the transmission type display device and the reflection type display device, we can see a feature in that materials forming pixel electrodes are different therebetween. For example, in the case where the transmission type display device is fabricated, it is sufficient to use a transparent electrode of ITO or the like as the pixel electrode 711 in FIG. 7 (or pixel electrode 1711 in FIG. 17). In the case where the reflection type display device is fabricated, it is sufficient to use an opaque electrode having a high reflectance as the pixel electrode 711 (or pixel electrode 1711).

In this way, by slightly changing the structure of the TFT, the present invention can be applied both the transmission type display device and the reflection type display device. Especially, since an opening rate does not make a problem for the reflection type display device, it has an advantage that the freedom of design is wider than the transmission type display device. For example, in the transmission type liquid crystal display device, a pixel region is almost constituted by a window portion through which light is transmitted, like the image display region 714 (or image display region 1714). On the other hand, in the reflection type liquid crystal display device, since other circuit can be formed on the back side of such an image display region, the decree of integration can be further increased.

[Embodiment 11]

Figure 18A:
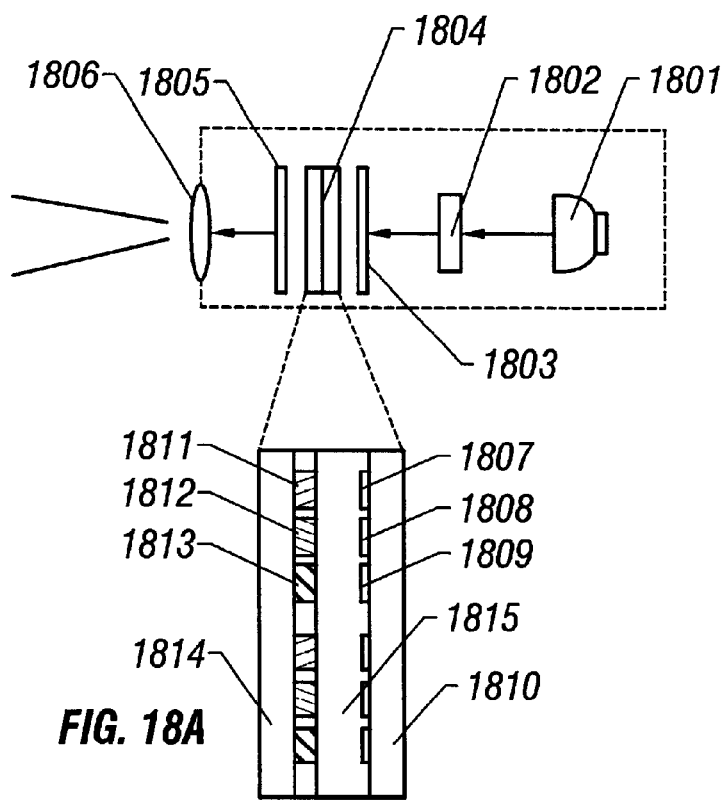
FIGS. 18A and 18B are views showing the structures of projection display devices.

FIG. 18A shows an example in which the present invention is applied to a color projection type liquid crystal display device. FIG. 18A shows an example of a single plate projector using one liquid crystal panel, which is constituted by a white light source 1801, a UV filter (or infrared ray filter) 1802, polarizing plates 1803 and 1805, a liquid crystal panel 1804, and a projection lens 1806. A halogen lamp, a metal halide lamp, a high luminance lamp, or the like may be used as the white light source 1801.

As shown in an enlarged drawing in FIG. 18A, the liquid crystal panel 1804 is constituted by an active matrix substrate 1810 on which a pixel region 1807 corresponding to R (red), a pixel region 1808 corresponding to G (green), and a pixel region 1809 corresponding to B (blue) are formed, an opposite substrate 1814 on which a color filter 1811 corresponding to R (red), a color filter 1812 corresponding to G (green), and a color filter 1813 corresponding to B (blue) are formed. and a liquid crystal layer 1815 held between the substrates.

Various structures other than the above may be used. For example, a method in which light from a light source is divided into RGB by a dichroic mirror, and the respective light beams are condensed to the respective pixel regions corresponding to RGB by using micro lenses, may be used.

Figure 18B:
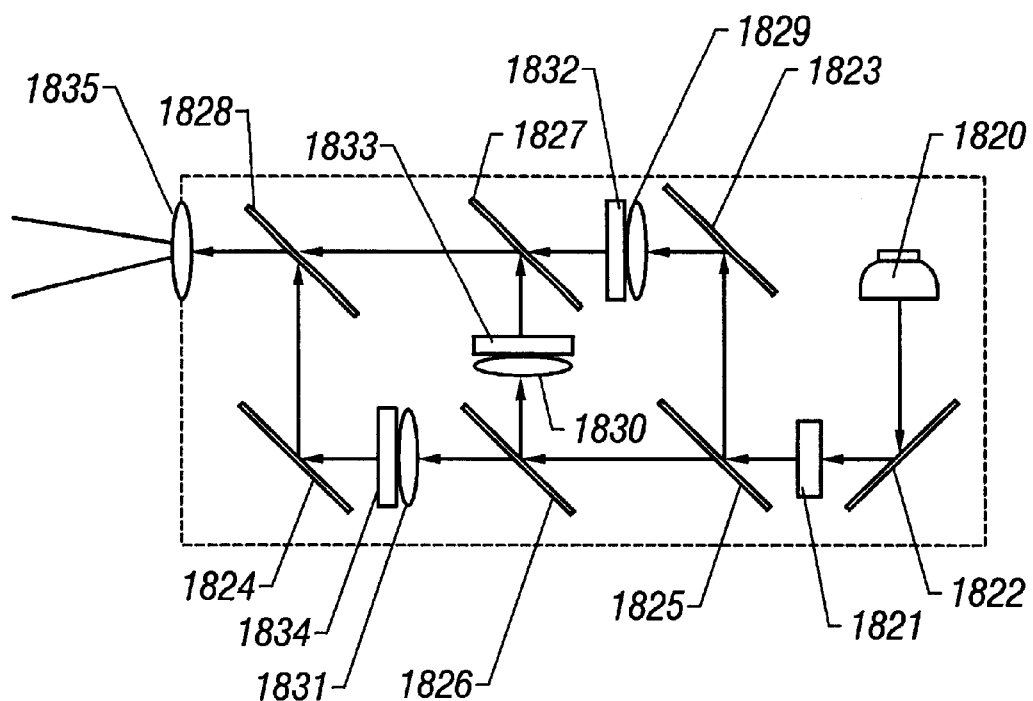

FIG. 18B shows an example of a three-plate projector using three liquid crystal panels corresponding to RGB, which is constituted by a white light source 1820, a UV filter (or infrared ray filter) 1821, total reflection mirrors 1822 to 1824, dichroic mirrors 1825 to 1828. condenser lenses 1829 to 1831, a liquid crystal panel 1832 corresponding to R, a liquid crystal panel 1833 corresponding to G, a liquid crystal panel 1834 corresponding to B, and a projection lens 1835.

The projection type liquid crystal display devices shown in FIGS. 18A and 18B may be a front surface projection type data projector, or a back surface projection type projector TV.

When the active matrix display of the present invention is used as the projection type liquid crystal display device, such a structure is obtained that a logic circuit, for example, a signal processing circuit is incorporated in a liquid crystal panel. Thus, it is possible to greatly miniaturize the device and to lower the cost.

[Embodiment 12]

The present invention can be applied to various electrooptical devices in addition to the projection type liquid crystal display device shown in the embodiment 11. In this embodiment, examples of electrooptical devices to which the present invention can be applied, will be described with reference to FIGS. 19A to 19E.

Other examples of electrooptical devices using the present invention include a (digital) video camera, a (digital) still camera, a head mount display, a car navigation system, a personal computer, a portable information terminal (mobile computer, portable telephone, etc.) and the like.

Figure 19A:
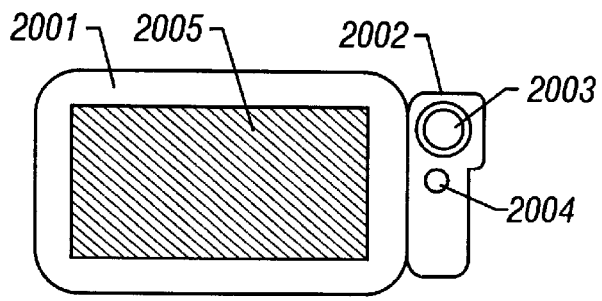
FIGS. 19A to 19E are views showing applied examples to electrooptical devices.

FIG. 19A shows a mobile computer, which is constituted by a main body 2001, a camera portion 2002, an image receiving portion 2003, an operation switch 2004, and a display device 2005. When the present invention is applied to the display device 2005 to integrate a display controller circuit, an arithmetic circuit and the like, a card type mobile computer can be realized.

Figure 19B:
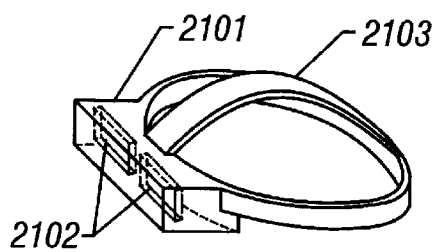

FIG. 19B shows a head mount display, which is constituted by a main body 2101, a display device 2102, and a band portion 2103. When the present invention is applied to the display device 2102, the device can be greatly miniaturized.

Figure 19C:
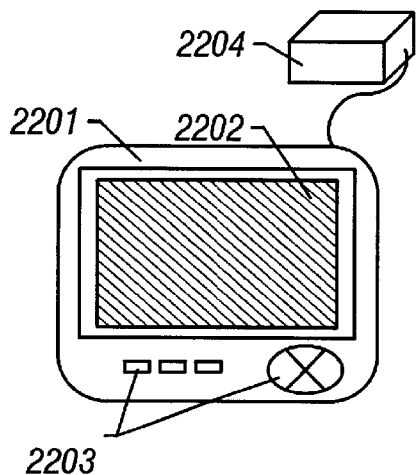

FIG. 19C shows a car navigation system, which is constituted by a main body 2201, a display device 2202, an operation switch 2203, and an antenna 2204. Since information from a satellite is transmitted to the car navigation system, a circuit with an extremely high driving frequency is necessary for signal processing. When the present invention is applied to the display device 2202, it is possible to further miniaturize the car navigation system and to lower the cost.

Figure 19D:
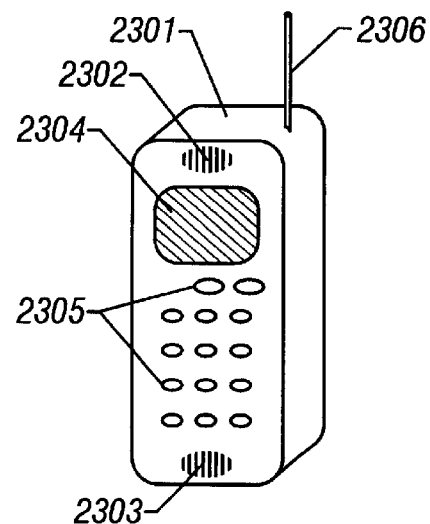

FIG. 19D shows a portable telephone, which is constituted by a main body 2301, an audio output portion 2302, an audio input portion 2303, a display device 2304, an operation switch 2305, and an antenna 2306. When the present invention is applied to the display device 23041. a digital display monitor can be mounted.

Figure 19E:
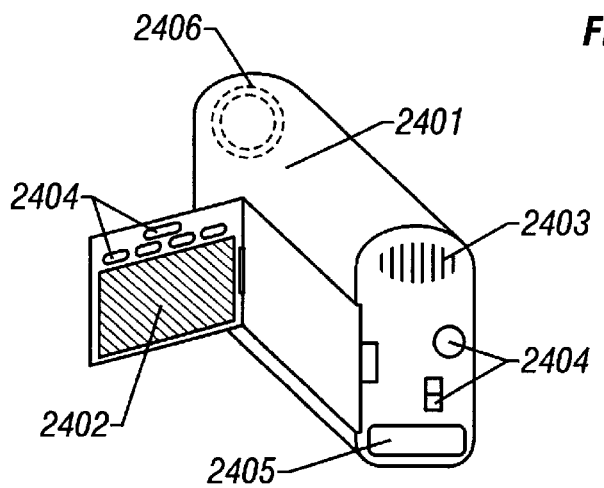

FIG. 19E shows a video camera, which is constituted by a main body 2401, a display device 240, an audio input portion 2403, an operation switch 2404, a battery 2405, and an image receiving portion 2406. When the present invention is applied to the display device 2402, the device structure is greatly simplified, so that an extremely miniaturized device can be realized.

As described above, the application range of the present invention is extremely wide, and the present invention can be applied to display mediums of any fields. Since the application of the present invention enables the active matrix display itself to have various functions, the size of the electrooptical device can be extremely miniaturized. In future, all electrooptical devices can be made portable electrooptical devices made into cards.

With respect to the effects obtained by the present invention, an effect of a basic technique important in practicing the present invention will first be set forth. The basic technique is to obtain the silicon thin film having the extremely unique crystal structure by carrying out a gettering process of a catalytic element with a halogen element for the crystal silicon which has been crystallized by using the catalytic element.

The TFT using the silicon thin film formed through the manufacturing steps described in the embodiment 1 has features that it has the subthreshold coefficient comparable to a MOSFET using single crystal silicon and high field effect mobility. The silicon thin film itself of the crystal structure body made of a group of a plurality of rod-shaped or flattened rod-shaped crystals has an effect to suppress the short channel effect, and even if the TFT is made minute, the characteristics of high withstand voltage and high speed operation can be realized without using a channel doping method or the like.

By using the TFT having such extremely high performance, that is, having wide ranges of a driving frequency and operating voltage, it becomes possible to form both a high frequency driving TFT and a high withstand voltage driving TFT on the same substrate.

Also, since the short channel effect can be suppressed without using the channel doping method, it is possible to realize TFTs having different operation performance by merely changing the channel length (L) of the TFT and the film thickness (T) of the ate insulating film thereof. Thus, by changing the channel length (L) and film thickness (T) of the gate insulating film according to the characteristics required by a circuit, it is possible to use the TFT having an intrinsic or substantially intrinsic channel formation region in the wide ranges of the driving frequency and operating voltage.

Since the above described effects are obtained, it is possible to realize a logic circuit integration type active matrix display in which both high frequency driving TFTs and high withstand voltage driving TFTs are mounted on the same substrate and in which a logic circuit, a driver circuit, and a pixel matrix circuit are arranged.

Since the active matrix display of the present invention can be provided with not only the pixel matrix circuit and the driver circuit. but also a display control circuit, a memory circuit, and a tonic circuit capable of ultimately including an arithmetic circuit, it functions as a system display superior in multifunction and portability. Further, since the high frequency driving circuit is designed so that the operating voltage does not become large more than necessity, the active matrix display of the present invention is superior in low consumption or electric power.

Further, when such an active matrix display is applied to an electrooptical device, for example, a projection type liquid crystal display device, it is possible to provide an extremely miniaturized. lightweight and inexpensive electrooptical device.

What is claimed is:

1. An active matrix display comprising:
    a pixel matrix circuit including at least a plurality of source lines, a plurality of gate lines, and a plurality of TFTs;
    a driver circuit including at least a source line driver circuit for driving the source lines and a gate line driver circuit for driving the gate lines; and
    a frequency divider circuit operationally connected to the driver circuit,
    wherein the pixel matrix circuit, the driver circuit and the frequency divider circuit are disposed over the same substrate,
    wherein the pixel matrix circuit, the driver circuit, and the frequency divider circuit are constituted by a plurality of TFTs each having a crystalline semiconductor film comprising crystalline silicon as an active layer thereof, and
    wherein one of the TFTs which constitute said frequency divider circuit is operated at a frequency of 0.1 to 0.5 GHz, has a channel length not lower than 0.5 mm and has a gate insulating film having a thickness of not larger than 600 Å, and the active layer in said one of the TFTs contains a metal at a concentration $1 \times 10^{17}$ atoms/cm$^3$ or lower.

2. The display according to claim 1 wherein said display is an EL display.

3. The display according to claim 1 wherein said display is a liquid crystal display.

4. The display according to claim 1 wherein said metal is selected from the group consisting of Ni, Fe, Co, Sn, Pd, Pb, Pt, Cu, and Au.

5. A semiconductor device comprising:
    a substrate having an insulating surface; and
    a circuit operated at a frequency within a range form 0.1 to 0.5 GHz, formed over said substrate, said circuit comprising at least one thin film transistor, wherein said thin film transistor comprises a crystalline semiconductor film including a channel region therein, a gate insulating film adjacent to said crystalline semiconductor film and a gate electrode adjacent to said gate insulating film wherein said crystalline semiconductor film is formed by heating an amorphous semiconductor film together with a crystallization promoting material comprising a metal,
    wherein a thickness of said gate insulating film is not larger than 600 Å and a channel length of said thin film transistor is not smaller than 0.5 mm, and a subthreshold coefficient of the thin film transistor is from 60 to 100 mV/decade,
    wherein said semiconductor film contains said metal at a concentration $1 \times 10^{17}$ atoms/cm$^3$ or lower.

6. A semiconductor device according to claim 5 wherein said channel length is within a range of 0.5 to 1 mm.

7. A semiconductor device according to claim 5 wherein said gate insulating film is within a range from 400 to 600 Å.

8. A semiconductor device according to claim 5 wherein said circuit is a horizontal scanning oscillator circuit or a vertical scanning oscillator circuit.

9. A semiconductor device according to claim 5 wherein said circuit is a phase comparator circuit.

10. A semiconductor device according to claim 5 wherein said circuit is a voltage controlled oscillator.

11. A semiconductor device according to claim 5 wherein said circuit is a frequency divider circuit.

12. A semiconductor device according to claim 5 wherein said semiconductor device is an EL device.

13. A semiconductor device according to claim 5 wherein said semiconductor device is selected from the group consisting of a mobile computer, head mount display, a car navigation system, a portable telephone, a projector, and a video camera.

14. The display according to claim 5 wherein said metal is selected from the group consisting of Ni, Fe, Co, Sn, Pd, Pb, Pt, Cu, and Au.

15. A semiconductor device comprising:
    a substrate having an insulating surface; and
    a circuit formed over said substrate operated at a frequency of 0.2 GHz or higher, said circuit comprising at least one thin film transistor, wherein said thin film transistor comprises a crystalline semiconductor film including a channel region therein, a gate insulating film adjacent to said crystalline semiconductor film and a gate electrode adjacent to said gate insulating film wherein said crystalline semiconductor film is formed by heating an amorphous semiconductor film with a crystallization promoting material comprising a metal, wherein a thickness of said gate insulating film is not larger than 400 Å and a channel length of said thin film transistor is not smaller than 0.1 mm, and a subthreshold coefficient of the thin film transistor is from 60 to 100 mV/decade, wherein said semiconductor film contains said metal at a concentration $1 \times 10^{17}$ atoms/cm$^3$ or lower.

16. A semiconductor device according to claim 15 wherein said channel length is within a range of 0.1 to 0.5 mm.

17. A semiconductor device according to claim 15 wherein said gate insulating film is within a range from 200 to 400 Å.

18. A semiconductor device according to claim 15 wherein said circuit is an arithmetic circuit.

19. A semiconductor device according to claim 15 wherein said circuit is a memory circuit.

20. A semiconductor device according to claim 15 wherein said semiconductor device is an EL device.

21. A semiconductor device according to claim 15 wherein said semiconductor device is selected from the group consisting of a mobile computer, head mount display, a car navigation system, a portable telephone, a projector, and a video camera.

22. A semiconductor device according to claim 15 wherein said crystalline semiconductor film comprises a plurality of rod-shaped crystals extending in one direction.

23. The display according to claim 15 wherein said metal is selected from the group consisting of Ni, Fe, Co, Sn, Pd, Pb, Pt, Cu, and Au.

24. A semiconductor device comprising:
 a substrate having an insulating surface; and
 a circuit operated at a frequency of at least 25 MHz, formed over said substrate, said circuit comprising at least one thin film transistor, wherein said thin film transistor comprises a crystalline semiconductor film including a channel region therein, a gate insulating film adjacent to said crystalline semiconductor film and a gate electrode adjacent to said gate insulating film wherein said crystalline semiconductor film is formed by a method comprising a step of heating an amorphous semiconductor film together with a crystallization promoting material comprising a metal, wherein a thickness of said gate insulating film is not smaller than 1000 Å and a channel length of said thin film transistor is not smaller than 1.5 mm, and a subthreshold coefficient of the thin film transistor is from 60 to 100 mV/decade, and wherein said semiconductor film contains said metal at a concentration $1 \times 10^{17}$ atoms/cm$^3$ or lower.

25. A semiconductor device according to claim 24 wherein said channel length is within a range of 1.5 to 2.5 mm.

26. A semiconductor device according to claim 24 wherein said gate insulating film is within a range from 1000 to 2000 Å.

27. A semiconductor device according to claim 24 wherein said circuit is a horizontal or vertical shift register circuit.

28. A semiconductor device according to claim 24 wherein said semiconductor device is an EL device.

29. A semiconductor device according to claim 24 wherein said semiconductor device is selected from the group consisting of a mobile computer, head mount display, a car navigation system, a portable telephone, a projector, and a video camera.

30. A semiconductor device according to claim 24 wherein said crystalline semiconductor film comprises a plurality of rod-shaped crystals extending in one direction.

31. The display according to claim 24 wherein said metal is selected from the group consisting of Ni, Fe, Co, Sn, Pd, Pb, Pt, Cu, and Au.

32. An active matrix display comprising:
 a pixel matrix circuit including at least a plurality of source lines, a plurality of gate lines, and a plurality of TFTs;
 a driver circuit including at least a source line driver circuit for driving the source lines and a gate line driver circuit for driving the gate lines; and
 a frequency divider circuit operationally connected to the driver circuit,
 wherein the pixel matrix circuit, the driver circuit and the frequency driver circuit are disposed over the same substrate,
 wherein the pixel matrix circuit, the driver circuit, and the frequency divider circuit are constituted by a plurality of TFTs each having a crystalline semiconductor film comprising crystalline silicon as an active layer thereof, and
 wherein one of the TFTs which constitute said frequency divider circuit is operated at a frequency of 0.1 to 0.5 GHz, has a channel length not lower than 0.5 mm, and the active layer in said one of the TFTs contains a metal at a concentration $1 \times 10^{17}$ atoms/cm$^3$ or lower.

* * * * *

UNITED STATES PATENT AND TRADEMARK OFFICE
CERTIFICATE OF CORRECTION

PATENT NO.   : 6,271,818 B1  
DATED        : August 7, 2001  
INVENTOR(S)  : Shunpei Yamazaki, Jun Koyama and Hisashi Ohtani Page 1 of 1

It is certified that error appears in the above-identified patent and that said Letters Patent is hereby corrected as shown below:

Column 32,  
Lines 6 and 33, please correct "0.5 mm" to read -- 0.5 $\mu$m --; and  
Line 39, please correct "0.5 to 1 mm" to read -- 0.5 to 1 $\mu$m --.

Column 33,  
Line 10, please correct "0.1 mm" to read -- 0.1 $\mu$m --; and  
Line 16, please correct "0.1 to 0.5 mm" to read -- 0.1 to 0.5$\mu$m --.

Column 34,  
Line 1, please correct "1.5 mm" to read -- 1.5 $\mu$m --;  
Lines 7 and 8, please correct "1.5 to 2.5 mm" to read -- 1.5 to 2.5 $\mu$m --; and  
Line 49, please change "0.5 mm" to read -- 0.5 $\mu$m --.

Signed and Sealed this

Sixteenth Day of December, 2003

JAMES E. ROGAN  
*Director of the United States Patent and Trademark Office*